United States Patent
Honda

(10) Patent No.: US 6,784,468 B2
(45) Date of Patent: Aug. 31, 2004

(54) FERROELECTRIC MEMORY

(75) Inventor: Toshiyuki Honda, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 259 days.

(21) Appl. No.: 09/988,817

(22) Filed: Nov. 20, 2001

(65) Prior Publication Data

US 2002/0089870 A1 Jul. 11, 2002

(30) Foreign Application Priority Data

Nov. 30, 2000 (JP) ........................................ 2000-365276

(51) Int. Cl.[7] .............................................. H01L 27/10

(52) U.S. Cl. ...................... 257/208; 257/209; 257/210; 257/295; 257/296

(58) Field of Search ................................ 257/202, 295, 257/296, 208–211; 365/65, 145, 149

(56) References Cited

U.S. PATENT DOCUMENTS

2002/0031885 A1 * 3/2002 Takashima .................. 438/240
2003/0169616 A1 * 9/2003 Noro .......................... 365/145

* cited by examiner

Primary Examiner—Minh-Loan Tran
(74) Attorney, Agent, or Firm—McDermott Will & Emery LLP

(57) ABSTRACT

A ferroelectric memory has a plurality of memory cells each having a transistor and a ferroelectric capacitor arranged in a matrix. Plate lines run in the word line direction above the ferroelectric capacitors of memory cells adjacent to each other in the word line direction among the plurality of memory cells. Bit line contacts each for connecting a bit line and an active region of the transistor are placed in regions between the plate lines adjacent to each other in the bit line direction and between the ferroelectric capacitors adjacent to each other in the word line direction. Cuts are formed at positions of the plate lines near the bit line contacts. The active regions of the transistors of the plurality of memory cells extend in directions intersecting with the word line direction and the bit line direction.

3 Claims, 30 Drawing Sheets

US 6,784,468 B2

FERROELECTRIC MEMORY

BACKGROUND OF THE INVENTION

The present invention relates to a ferroelectric memory in which a plurality of memory cells each having a transistor and a ferroelectric capacitor are arranged in a matrix.

FIG. 25 shows a circuit configuration of a ferroelectric memory common to first and second conventional examples and embodiments of the present invention. As shown in FIG. 25, a ferroelectric memory cell is of a one-transistor one-capacitor type having one transistor and one ferroelectric capacitor. A gate electrode of the transistor of the ferroelectric memory cell is connected to a word line and a drain electrode of the transistor is connected to a bit line. One electrode of the capacitor of the ferroelectric memory cell is connected to a plate line and the other electrode of the capacitor is connected to a source electrode of the transistor. Thus, the ferroelectric memory cell is controlled by signals applied to the plate line, the word line and the bit line.

(First conventional example)

Hereinafter, a ferroelectric memory of the first conventional example will be described with reference to FIGS. 26, 27 and 28.

FIGS. 26 and 27 show a layout of a ferroelectric memory cell array in the first conventional example, and FIG. 28 shows a cross-sectional structure taken along line D—D of FIGS. 26 and 27. Note that FIG. 27 is a view showing only active regions, word lines, bit line contacts and storage node contacts taken from the layout of FIG. 26.

Referring to FIGS. 26, 27 and 28, the reference numerals 11a, 11b, 11c and 11d denote plate lines constructed of upper electrodes of ferroelectric capacitors. The reference numerals 12a, 12b, 12c and 12d denote word lines made of polycrystalline silicon constructed of gate electrodes of access transistors. The reference numerals 13a, 13b, 13c and 13d denote bit lines made of aluminum interconnections. The reference numerals 14a, 14b, 14c and 14d denote storage nodes of ferroelectric memory cells, each constructed of a lower electrode of the ferroelectric capacitor. The reference numeral 18 denotes a one-bit ferroelectric memory cell of the one-transistor one-capacitor type, and the reference numeral 19 denotes a transistor constituting the ferroelectric memory cell 18. The reference numeral 15 denotes storage node contacts connecting the storage nodes 14a, 14b, 14c and 14d and active regions 16 of the transistors 19, and the reference numeral 17 denotes bit line contacts connecting the bit lines 13a, 13b, 13c and 13d and the active regions 16 of the transistors 19.

Referring to FIG. 26, the reference code a1 denotes the first inter-plate distance between the adjacent plate lines 11a and 11b with the bit line contacts 17 therebetween, b1 denotes the line width of the plate lines 11a and 11b including the storage nodes 14a, and c1 denotes the second inter-plate distance between the adjacent plate lines 11b and 11c without the bit line contacts 17 therebetween.

As shown in FIG. 26, the storage node contact 15 and the bit line contact 17 are placed at the shortest distance from each other via the active region 16.

(Second conventional example)

Hereinafter, a ferroelectric memory of the second conventional example will be described with reference to FIGS. 29, 30 and 31.

FIGS. 29 and 30 show a layout of a ferroelectric memory cell array in the second conventional example, and FIG. 31 shows a cross-sectional structure taken along line E—E of FIGS. 29 and 30. Note that FIG. 30 is a view showing only active regions, word lines, bit line contacts and storage node contacts taken from the layout of FIG. 29.

Referring to FIGS. 29, 30 and 31, the reference numerals 21a, 21b, 21c and 21d denote plate lines constructed of upper electrodes of ferroelectric capacitors. The reference numerals 22a, 22b, 22c and 22d denote word lines made of polycrystalline silicon constructed of gate electrodes of access transistors. The reference numerals 23a, 23b, 23c and 23d denote bit lines made of aluminum interconnections. The reference numerals 24a, 24b, 24c and 24d denote storage nodes of ferroelectric memory cells, each constructed of a lower electrode of the ferroelectric capacitor. The reference numeral 28 denotes a one-bit ferroelectric memory cell composed of one transistor and one capacitor, and the reference numeral 29 denotes the transistor constituting the ferroelectric memory cell 28. The reference numeral 25 denotes storage node contacts connecting the storage nodes 24a, 24b, 24c and 24d and active regions 26 of the transistors 29, and the reference numeral 27 denotes bit line contacts connecting the bit lines 23a, 23b, 23c and 23d and the active regions 26 of the transistors 29.

Referring to FIG. 29, the reference code a2 denotes the first inter-plate distance between the adjacent plate lines 21a and 21b with the bit line contacts 27 therebetween, b1 denotes the line width of the plate lines 21a and 21b including the storage nodes 24a, and c1 denotes the second inter-plate distance between the adjacent plate lines 21b and 21c without the bit line contacts 17 therebetween. The reference code d denotes the distance between one side edge of the word line 22a and the center of the bit line contact 27, e denotes the line width of the word line 22a, and f denotes the distance between the other side edge of the word line 22a and the center of the storage node contact 25. The first inter-plate distance a2 in the second conventional example is not the shortest distance obtainable by machining the plate lines 21a and 21b.

The distance between the storage node contact 25 and the bit line contact 27 is set to be the shortest via the active region 26, which is the sum of the line width e of the word line 22a, the distance d between one side edge of the word line 22a and the center of the bit line contact 27, and the distance f between the other side edge of the word line 22a and the center of the storage node contact 25.

(Problems of the first conventional example)

In the first conventional example, the length L11 of the ferroelectric memory cell 18 in the bit line direction satisfies $L11 = a1/2 + b1 + c1/2$.

Therefore, the area S11 of the ferroelectric memory cell 18 is represented by $$S11 = L11 \times W11 = (a1/2 + b1 + c1/2) \times W11$$

wherein W11 is the length of the ferroelectric memory cell 18 in the word line direction.

In general, a predetermined space is required between the edge of the plate line 11a, 11b, 11c or 11d on the side of the bit line contacts and the bit line contacts for prevention of short-circuiting therebetween. For this reason, the first inter-plate distance a1 between the adjacent plate lines 11a and 11b with the bit line contacts 17 therebetween is greater than the second inter-plate distance c1 between the adjacent plate lines 11b and 11c without the bit line contacts 17 therebetween, that is, $a1 > c1$.

Therefore, in the first conventional example, the area S11 of the ferroelectric memory cell 18 disadvantageously increases compared with the case in which all the inter-plate distances are equal to the second inter-plate distance c1, that is, a1=c1.

In addition, in the first conventional example, in order to drive the plate line 11a for read/write of data from/in the ferroelectric memory cell 18, all of the bit lines 13a, 13b, 13c and 13d connected to the plate line 11a via the word line 12a are used simultaneously. In this occasion, since the bit lines 13a, 13b, 13c and 13d are adjacent to each other, noise is generated due to the capacitance existing between the bit lines, and this may easily cause a malfunction.

(Problems of the second conventional example)

In the second conventional example, the length L12 of the ferroelectric memory cell 28 in the bit line direction satisfies L12=d+e+f+b1/2+c1/2.

Since the minimum value of the first inter-plate distance a2 between the adjacent plate lines 21a and 21b with the bit line contacts 27 therebetween is equal to the first inter-plate distance a1 in the first conventional example, the following relationship is satisfied.

$$d+e+f=a2/1+b1/2>a1/2+b1/2$$

From this relationship and the relationship a1>c1 described in the first conventional example, the following relationship is satisfied.

$$d+e+f=a2/1+b1/2>c1/2+b1/2.$$

As a recent tendency, the operating voltage has been increasingly made lower with achievement of finer semiconductor devices. Ferroelectric capacitors however fail to operate sufficiently with a low voltage. Therefore, a voltage higher than the operating voltage for the surrounding circuits must be applied to the ferroelectric capacitors. In consideration of this, as transistors constituting ferroelectric memory cells, it is necessary to use transistors having a larger gate length and operating with a higher voltage, compared with transistors for the surrounding circuits.

However, in the second conventional example, if the gate length (the line width e of the word line 22a) is made large, the area of the ferroelectric memory cell 28 and thus the area of the ferroelectric memory cell array disadvantageously increase.

SUMMARY OF THE INVENTION

In view of the above, a first object of the present invention is reducing the area of ferroelectric memory cells, and the second object is preventing the area of ferroelectric memory cells from increasing even when the gate length of transistors is made large.

To attain the first object, the first ferroelectric memory of the present invention is a ferroelectric memory in which a plurality of memory cells each having a transistor and a ferroelectric capacitor are arranged in a matrix, wherein plate lines run in the word line direction above the ferroelectric capacitors of memory cells adjacent to each other in the word line direction among the plurality of memory cells, bit line contacts each for connecting a bit line and an active region of the transistor are placed in regions between the plate lines adjacent to each other in the bit line direction and between the ferroelectric capacitors adjacent to each other in the word line direction, cut portions are formed at positions of the plate lines near the bit line contacts, and the active regions of the transistors of the plurality of memory cells extend in directions intersecting with the word line direction and the bit line direction.

According to the first ferroelectric memory, cut portions are formed at positions of the plate lines near the bit line contacts, and the active regions of the transistors extend in directions intersecting with the word line direction and the bit line direction. Therefore, since the length of the memory cells in the bit line direction can be made small, the area of the memory cell and thus the area of the memory cell array can be reduced, compared with the first conventional example.

To attain the first object, the second ferroelectric memory of the present invention is a ferroelectric memory in which a plurality of memory cells each having a transistor and a ferroelectric capacitor are arranged in a matrix, wherein ferroelectric capacitors of one set of memory cells adjacent to each other in the word line direction among the plurality of memory cells are placed at positions offset from each other in the bit line direction, a word line is placed in common for the transistors of the set of memory cells, a plate line is placed in common for the ferroelectric capacitors of the set of memory cells, and bit line contacts each for connecting a bit line and an active region of the transistor are placed between the plate lines adjacent to each other in a bit line direction.

According to the second ferroelectric memory, ferroelectric capacitors of one set of memory cells adjacent to each other in the word line direction are placed at positions offset from each other in the bit line direction. Therefore, the length of the memory cell in the word line direction is greatly reduced compared with the first conventional example. In addition, a plate line is placed in common for the ferroelectric capacitors of the set of memory cells, and bit line contacts are placed between the plate lines. Therefore, the length of the memory cell in the bit line direction increases only by a rate smaller than the reciprocal of the rate of reduction of the length of the memory cell in the word line direction, with respect to the first conventional example. Thus, the area of the memory cell and thus the area of the memory cell array can be reduced, compared with the first conventional example.

To attain the first object, the third ferroelectric memory of the present invention is a ferroelectric memory in which a plurality of memory cells each having a transistor and a ferroelectric capacitor are arranged in a matrix, wherein ferroelectric capacitors of one set of memory cells adjacent to each other in the word line direction among the plurality of memory cells are placed at positions offset from each other in the bit line direction, a word line is placed in common for the transistors of the set of memory cells, plate lines are placed separately for the respective ferroelectric capacitors of the set of memory cells, and bit line contacts each for connecting a bit line and an active region of the transistor are placed between plate line groups each composed of the plurality of plate lines corresponding to the set of memory cells.

According to the third ferroelectric memory, ferroelectric capacitors of one set of memory cells adjacent to each other in the word line direction are placed at positions offset from each other in the bit line direction. Therefore, the length of the memory cell in the word line direction is greatly reduced compared with the first conventional example. In addition, bit line contacts are placed between plate line groups each composed of the plurality of plate lines corresponding to the set of memory cells. Therefore, the length of the memory cell in the bit line direction increases only by a rate smaller than the reciprocal of the rate of reduction of the length of the memory cell in the word line direction, with respect to the first conventional example. Thus, the area of the memory cell and thus the area of the memory cell array can be reduced, compared with the first conventional example.

In the third ferroelectric memory, plate lines are placed separately for the respective ferroelectric capacitors of the set of memory cells. Therefore, although the length of the memory cell in the bit line direction is larger compared with the second ferroelectric memory, the bit lines for sending signals to the ferroelectric capacitors of the set of memory cells do not share the same plate line. This prevents generation of noise due to the capacitance existing between the bit lines, and thus prevents occurrence of a malfunction due to noise.

To attain the first object, the fourth ferroelectric memory of the present invention is a ferroelectric memory in which a plurality of memory cells each having a transistor and a ferroelectric capacitor are arranged in a matrix, wherein ferroelectric capacitors of one set of memory cells adjacent to each other in the word line direction among the plurality of memory cells are placed at positions offset from each other in the bit line direction, a plate line is placed in common for the ferroelectric capacitors of the set of memory cells, and bit line contacts each for connecting a bit line and an active region of the transistor are placed on both sides of the plate line in the bit line direction.

According to the fourth ferroelectric memory, ferroelectric capacitors of one set of memory cells adjacent to each other in the word line direction are placed at positions offset from each other in the bit line direction. Therefore, the length of the memory cell in the word line direction is greatly reduced compared with the first conventional example. In addition, a plate line is placed in common for the ferroelectric capacitors of the set of memory cells, and bit line contacts are placed on both sides of the plate line in the bit line direction. Therefore, the length of the memory cell in the bit line direction increases only by a rate smaller than the reciprocal of the rate of reduction of the length of the memory cell in the word line direction, with respect to the first conventional example. Thus, the area of the memory cell and thus the area of the memory cell array can be reduced, compared with the first conventional example.

To attain the second object, the fifth ferroelectric memory of the present invention is a ferroelectric memory in which a plurality of memory cells each having a transistor and a ferroelectric capacitor are arranged in a matrix, wherein active regions of the transistors of the plurality of memory cells extend through between the ferroelectric capacitors in the bit line direction, and word lines include: gate electrodes having a relatively large width formed above portions of the active regions extending through between the ferroelectric capacitors in the bit line direction; and interconnections of the ferroelectric capacitors having a relatively small width and extending in the bit line direction.

According to the fifth ferroelectric memory, word lines include: gate electrodes having a relatively large width formed above portions of the active regions extending through between the ferroelectric capacitors in the bit line direction; and interconnections of the ferroelectric capacitors having a relatively small width and extending in the bit line direction. Therefore, it is possible to form the word lines so that both the gate electrodes and the interconnections of the word lines do not protrude from the regions of the plate lines running in the word line direction even when the gate length of the transistors is set equal to the gate length of the transistors in the second conventional example. Therefore, since the length of the memory cell in the bit line direction can be made small, the area of the memory cell and thus the area of the memory cell array can be reduced, compared with the second conventional example.

To attain the second object, the sixth ferroelectric memory of the present invention is a ferroelectric memory in which a plurality of memory cells each having a transistor and a ferroelectric capacitor are arranged in a matrix, wherein ferroelectric capacitors adjacent to each other in the bit line direction with a bit line contact therebetween among a plurality of ferroelectric capacitors constituting the plurality of memory cells are placed not to be offset from each other in the word line direction, while ferroelectric capacitors adjacent to each other in the bit line direction without a bit line contact therebetween among the plurality of ferroelectric capacitors constituting the plurality of memory cells are placed at positions offset from each other in the word line direction, active regions of the transistors of the plurality of memory cells extend through in the bit line direction between the ferroelectric capacitors adjacent to each other in the word line direction, and word lines include: gate electrodes having a relatively large width formed above the active regions; and interconnections of the ferroelectric capacitors having a relatively small width and extending in the bit line direction.

According to the fifth ferroelectric memory, word lines include: gate electrodes having a relatively large width formed above the active regions; and interconnections of the ferroelectric capacitors having a relatively small width and extending in the bit line direction. Therefore, it is possible to form the word lines so that both the gate electrodes and the interconnections of the word lines do not protrude from the regions of the plate lines running in the word line direction even when the gate length of the transistors is set equal to the gate length of the transistors in the second conventional example. Therefore, since the length of the memory cell in the bit line direction can be made small, the area of the memory cell and thus the area of the memory cell array can be reduced, compared with the second conventional example.

To attain the second object, the seventh ferroelectric memory of the present invention is a ferroelectric memory in which a plurality of memory cells each having a transistor and a ferroelectric capacitor are arranged in a matrix, wherein ferroelectric capacitors of a pair of memory cells adjacent to each other in the word line direction among the plurality of memory cells are placed at positions offset from each other in the bit line direction, a plate line is placed in common for the ferroelectric capacitors of the pair of memory cells, and a word line is placed in common for the transistors of the pair of memory cells and formed between the ferroelectric capacitors of the pair of memory cells.

According to the seventh ferroelectric memory, a plate line and a word line are placed in common for the ferroelectric capacitors of the pair of memory cells, and the word line is formed between the ferroelectric capacitors of the pair of memory cells. Therefore, since the length of the memory cell in the bit line direction can be made small, the area of the memory cell and thus the area of the memory cell array can be reduced, compared with the second conventional example, even when the gate length of the transistors is set equal to the gate length of the transistors in the second conventional example.

In the seventh ferroelectric memory, the line width of the word line is preferably set equal to or smaller than the distance between the ferroelectric capacitors of the pair of memory cells.

By the above setting, the length of the memory cell in the bit line direction can be made further small, and therefore the area of the memory cell and thus the area of the memory cell array can be further reduced.

To attain the second object, the eighth ferroelectric memory of the present invention is a ferroelectric memory in which a plurality of memory cells each having a transistor and a ferroelectric capacitor are arranged in a matrix, wherein ferroelectric capacitors of pairs of memory cells adjacent to each other in the word line direction among the plurality of memory cells are placed at positions offset from each other in the bit line direction, active regions of the transistors of ones of the pairs of memory cells extend through between the ferroelectric capacitors of the others of the pairs of memory cells in the bit line direction, intersecting with a plate line for the other memory cells, first word lines are provided for the transistors of the ones of the pairs of memory cells, while second word lines are provided for the transistors of the other memory cells, and the second word lines are narrowed at portions intersecting with the active regions of the transistors of the ones of the pairs of memory cells to a degree that the active regions are prevented from being turned to an OFF state.

According to the eighth ferroelectric memory, the second word lines are narrowed at portions intersecting with the active regions of the transistors of the ones of the pairs of memory cells to a degree that the active regions are prevented from being turned to an OFF state. Therefore, since the length of the memory cell in the bit line direction can be made small, the area of the memory cell and thus the area of the memory cell array can be reduced, compared with the second conventional example, even when the gate length of the transistors is set equal to the gate length of the transistors in the second conventional example.

To attain the second object, the ninth ferroelectric memory of the present invention is a ferroelectric memory in which a plurality of memory cells each having a transistor and a ferroelectric capacitor are arranged in a matrix, wherein bit lines are composed of active regions running through in the bit line direction between the ferroelectric capacitors of pairs of memory cells adjacent to each other in the word line direction among the plurality of memory cells, and provided integrally with active regions of the transistors of the plurality of memory cells, and word lines include: interconnections having a small width formed above the bit lines to prevent the bit lines from being turned to an OFF state; and gate electrodes having a width larger than the interconnections formed above the active regions of the transistors.

According to the ninth ferroelectric memory, word lines include: interconnections having a small width formed above the bit lines to prevent the bit lines from being turned to an OFF state; and gate electrodes having a width larger than the interconnections formed above the active regions of the transistors. Therefore, since the length of the memory cell in the bit line direction can be made small, the area of the memory cell and thus the area of the memory cell array can be reduced, compared with the second conventional example, even when the gate length of the transistors is set equal to the gate length of the transistors in the second conventional example.

DESCRIPTION OF THE PREFERRED EMBODIMENTS (First embodiment)

Hereinafter, a ferroelectric memory of the first embodiment will be described with reference to FIGS. 1, 2 and 3.

Figure 1:
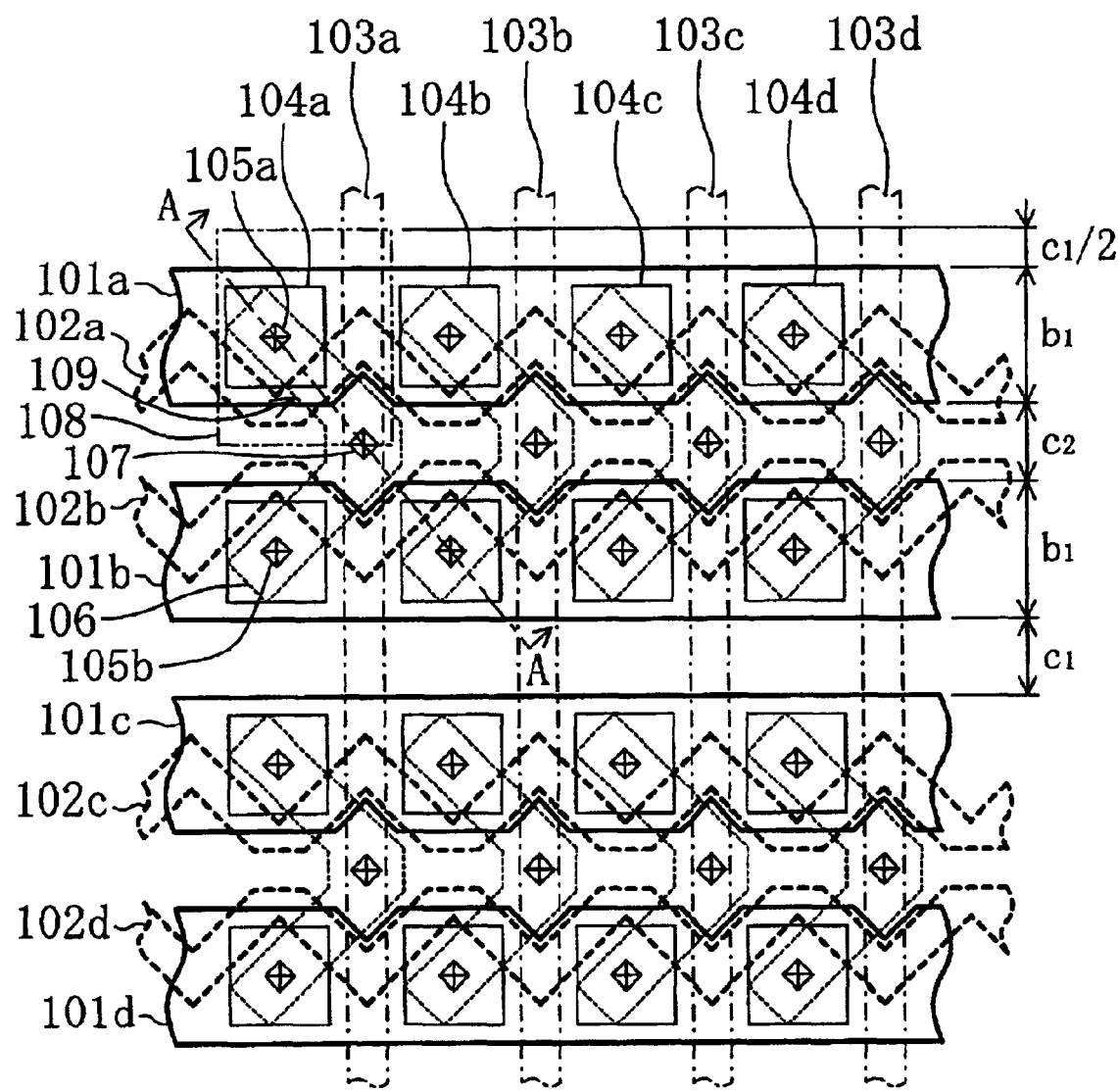
FIG. 1 is a layout of a ferroelectric memory of the first embodiment.
Figure 2:
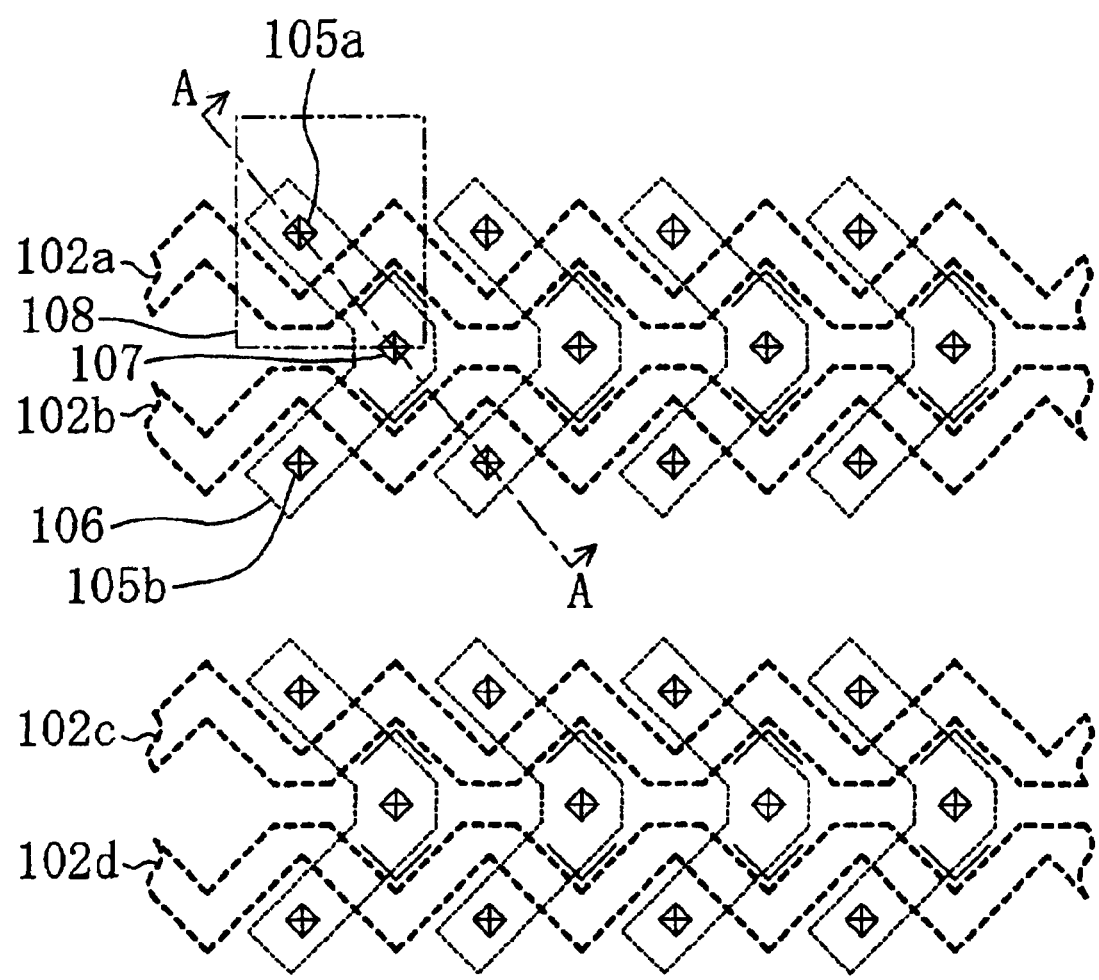
FIG. 2 is a layout of the ferroelectric memory of the first embodiment.
Figure 3:
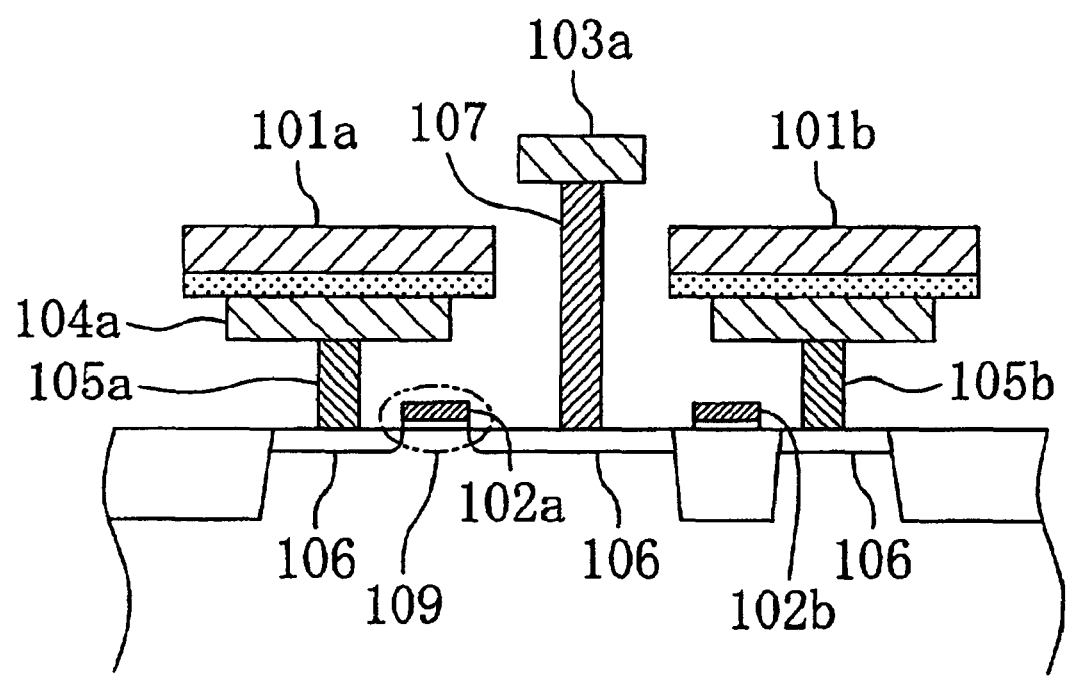
FIG. 3 is a cross-sectional view of the ferroelectric memory of the first embodiment, taken long line A—A of FIGS. 1 and 2.

FIGS. 1 and 2 show a layout of a ferroelectric memory cell array in the first embodiment, and FIG. 3 shows a cross-sectional structure taken along line A—A of FIGS. 1 and 2. Note that FIG. 2 is a view showing only active regions, word lines, bit line contacts and storage node contacts taken from the layout of FIG. 1.

Referring to FIGS. 1, 2 and 3, the reference numerals 101a, 101b, 101c and 101d denote plate lines constructed of upper electrodes of ferroelectric capacitors. The reference numerals 102a, 102b, 102c and 102d denote word lines made of polycrystalline silicon constructed of gate electrodes of access transistors. The reference numerals 103a, 103b, 103c and 103d denote bit lines made of aluminum interconnections. The reference numerals 104a, 104b, 104c and 104d denote storage nodes of ferroelectric memory cells, each constructed of a lower electrode of the ferroelectric capacitor. The reference numeral 108 denotes a one-bit ferroelectric memory cell of the one-transistor one-capacitor type, and the reference numeral 109 denotes a transistor constituting the ferroelectric memory cell 108. The reference numeral 105a denotes a storage node contact connecting the storage node 104a and an active region 106 of the transistor 109, and the reference numeral 107 denotes a bit line contact connecting the bit line 103a and the active region 106 of the transistor 109.

Referring to FIG. 1, the reference code b1 denotes the line width of the plate lines 110a to 110d including the storage nodes 104a to 104d, c1 denotes the first inter-plate distance between the adjacent plate lines 101b and 101c without the bit line contacts 107 therebetween, and c2 denotes the second inter-plate distance between the adjacent plate lines 101a and 101b with the bit line contacts 107 therebetween.

As shown in FIG. 1, the plate lines 101a to 101d run in the word line direction (lateral direction as is viewed from FIG. 1) above the storage nodes 104a to 104d of the ferroelectric memory cells 108 adjacent to each other in the word line direction.

The bit lines 103a to 103d run in the bit line direction (vertical direction as is viewed from FIG. 1) between the storage nodes 104a to 104d of the ferroelectric memory cells adjacent to each other in the word line direction.

The bit line contact 107 is placed at a position under the bit line 103a and between the adjacent plate lines (101a and 101b).

Cuts are formed at positions of the plate line 101a near the bit line contacts 107, to secure a predetermined gap between the side edge of the plate line 101a and the bit line contacts 107.

The word line 102a runs in a zigzag fashion navigating around the storage node contacts 105 and the bit line contacts 107.

The active regions 106 of the transistors 109 are formed in an L shape, connecting a pair of storage node contacts 105a and 105b adjacent to each other in the bit line direction and the bit line contact 107 adjacent to the paired storage node contacts 105a and 105b. Thus, the active regions 106 of the transistors 109 extend in directions intersecting with the word line direction and the bit line direction.

In the first embodiment, the second inter-plate distance c2 is set to be equal to the first inter-plate distance c1.

Therefore, the length L1 of the ferroelectric memory cell 108 in the bit line direction satisfies L1=b1+c1.

In the first conventional example, the length L11 of the ferroelectric memory cell 18 in the bit line direction satisfies L11=a1/2+b1+c1/2. Therefore, the difference in the length in the bit line direction between the ferroelectric memory cell in the first conventional example and that in the first embodiment, L11−L1, satisfies L11−L1=(a1−c1)/2. Since a1>c1 as described before, the relationship L11>L1 is established.

Thus, the area of the ferroelectric memory cell 108 in the first embodiment is smaller than the area of the ferroelectric memory cell 18 in the first conventional example.

(Modification of the first embodiment)

Figure 4:
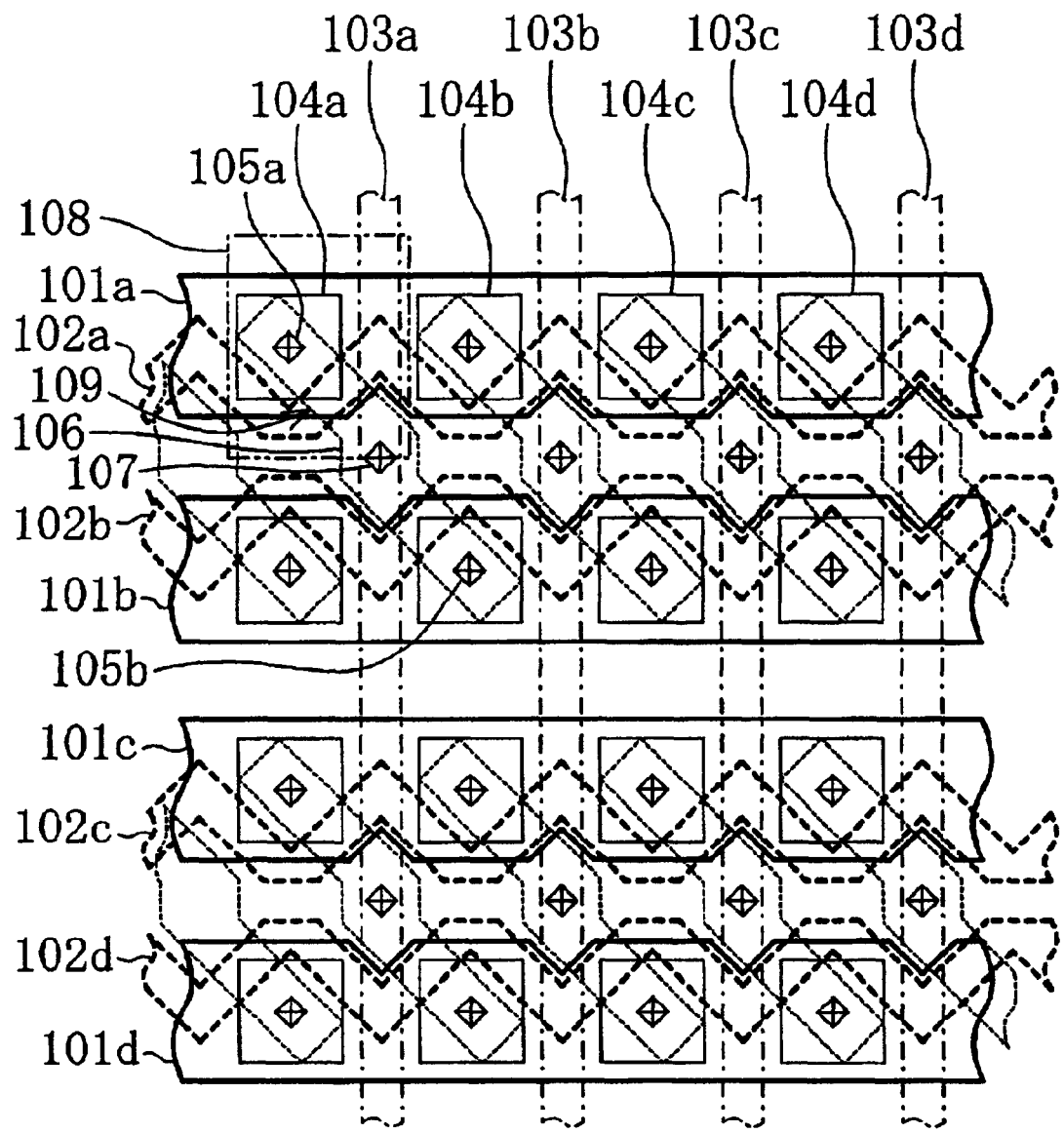
FIG. 4 is a layout of a ferroelectric memory of a modification of the first embodiment.

FIG. 4 shows a layout of a ferroelectric memory cell array in a modification of the first embodiment.

In the first embodiment described above, the active regions 106 of the transistors 109 is formed in an L shape, connecting the paired storage node contacts 105a and 105b adjacent to each other in the bit line direction and the bit line contact 107 adjacent to the paired storage node contacts 105a and 105b. In this modification, the active regions 106 of the transistors 109 are formed in a straight-line shape, connecting a pair of storage node contacts 105a and 105b adjacent diagonally to each other and the bit line contact 107 located between the paired storage node contacts 105a and 105b. Thus, the active regions 106 of the transistors 109 extend in directions intersecting with the bit line direction and the word line direction.

(Second embodiment)

Hereinafter, a ferroelectric memory of the second embodiment will be described with reference to FIGS. 5 and 6.

Figure 5:
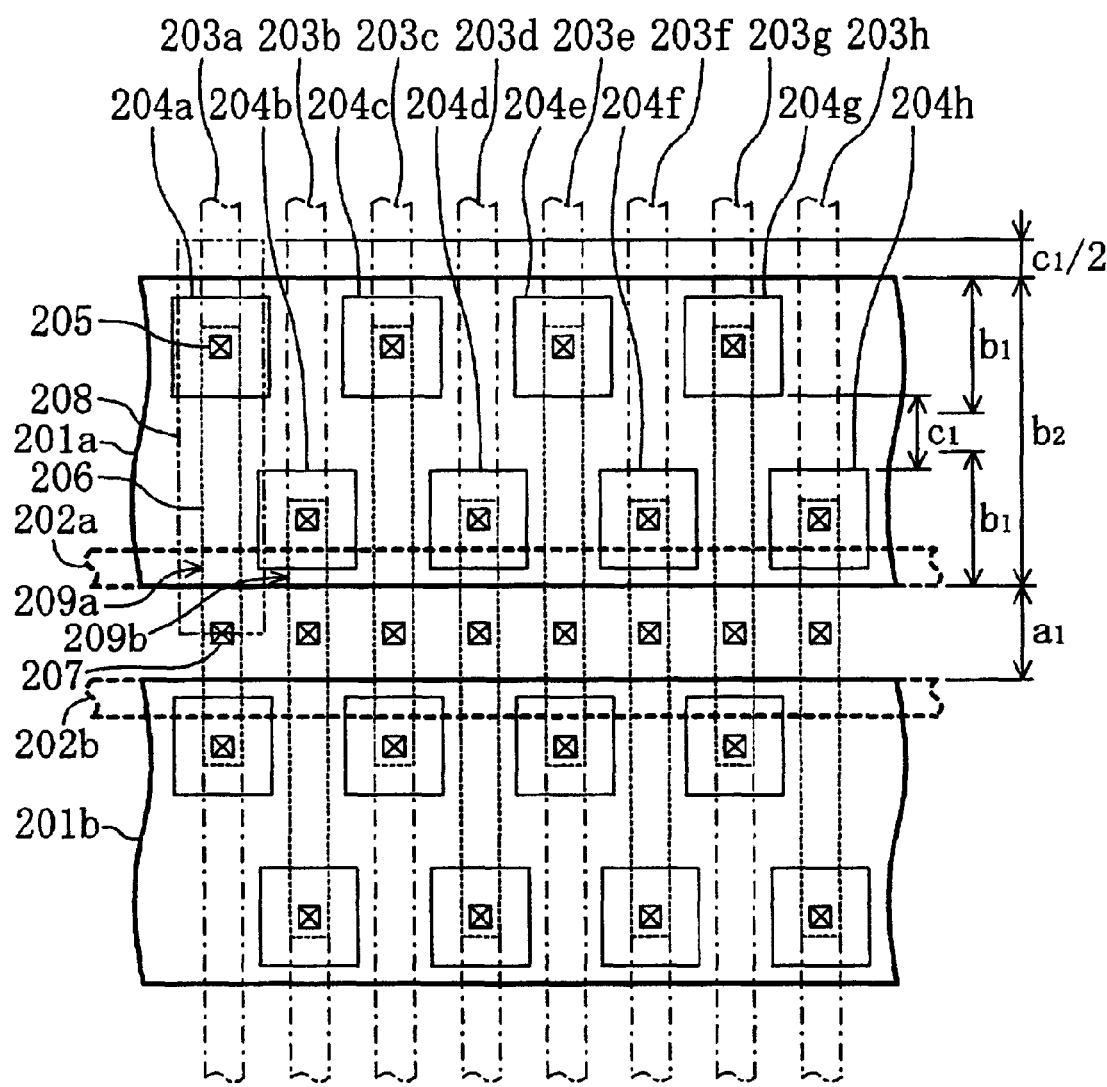
FIG. 5 is a layout of a ferroelectric memory of the second embodiment.
Figure 6:
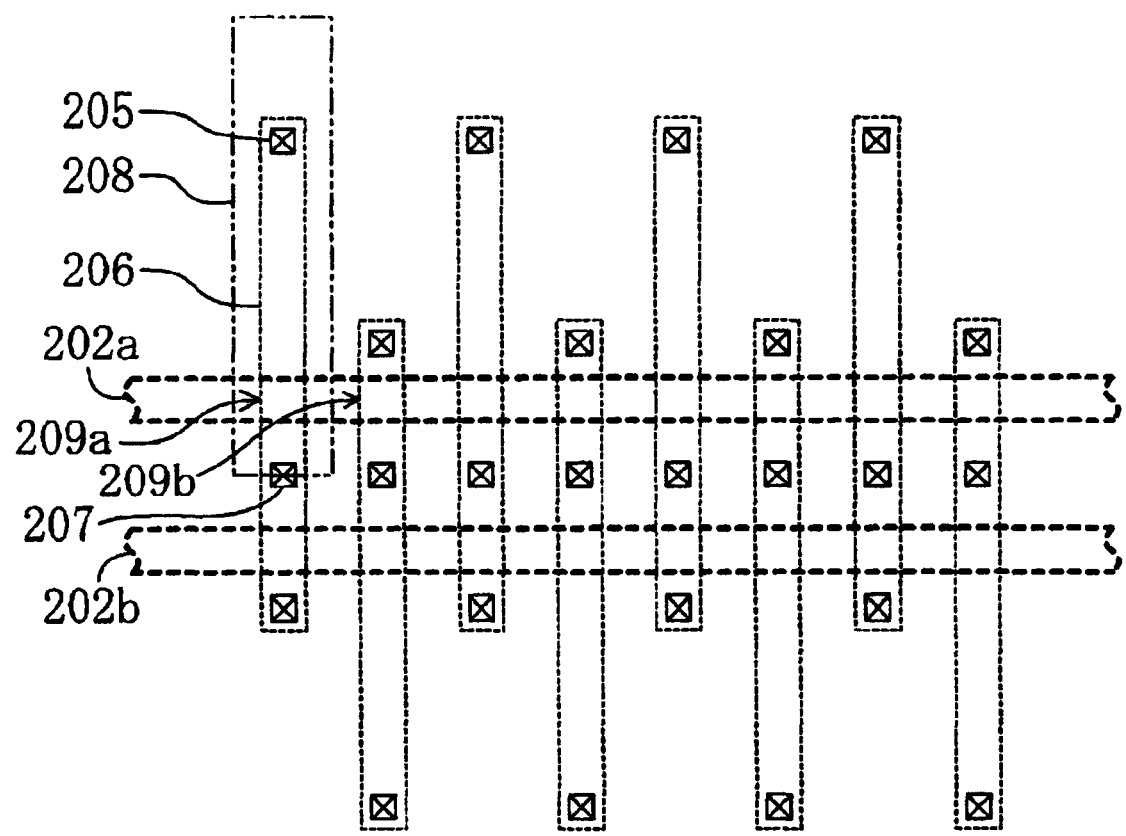
FIG. 6 is a layout of the ferroelectric memory of the second embodiment.

FIGS. 5 and 6 show a layout of a ferroelectric memory cell array in the second embodiment. Note that FIG. 2 is a view showing only active regions, word lines, bit line contacts and storage node contacts taken from the layout of FIG. 5.

Referring to FIGS. 5 and 6, the reference numerals 201a and 201b denote plate lines constructed of upper electrodes of ferroelectric capacitors. The reference numerals 202a and 202b denote word lines made of polycrystalline silicon constructed of gate electrodes of access transistors. The reference numerals 203a, 203b, 203c, 203d, 203e, 203f, 203g and 203h denote bit lines made of aluminum interconnections. The reference numerals 204a, 204b, 204c, 204d, 204e, 204f, 204g and 204h denote storage nodes of ferroelectric memory cells, each constructed of a lower electrode of the ferroelectric capacitor. The reference numeral 208 denotes a one-bit ferroelectric memory cell of the one-transistor one-capacitor type, and the reference numerals 209a and 209b denote transistors each constituting the ferroelectric memory cell 208. The reference numeral 205 denotes storage node contacts connecting the storage nodes 204a to 204h and active regions 206 of the transistors 209a and 209b, and the reference numeral 207 denotes bit line contacts connecting the bit lines 203a to 203h and the active regions 206 of the transistors 209a and 209b.

Referring to FIG. 5, the reference code a1 denotes the distance between the adjacent plate lines 201a and 201b, b1 denotes the line width of the plate lines 12a and 12b including the storage nodes in the first conventional example, b2 denotes the line width of the plate lines 201a and 201b each including the storage nodes 204a to 204h arranged in two lines, and c1 denotes the distance between each pair of the storage nodes (204a and 204b), (204c and 204d), (204e and 204f) and (204g and 204h) adjacent to each other in the bit line direction.

As shown in FIG. 5, the storage nodes (204a and 204b), (204c and 204d), (204e and 204f) and (204g and 204h) of the ferroelectric capacitors of the respective pairs of the ferroelectric memory cells 208 adjacent to each other in the word line direction are placed at positions offset from each other in the bit line direction.

The length of the ferroelectric memory cell 208 in the word line direction is set at a half of that of the ferroelectric memory cell 18 in the first conventional example.

The plate lines 201a and 201b are each provided in common for the storage nodes 204a to 204h of the ferroelectric capacitors of the pairs of the memory cells placed at positions offset from each other in the bit line direction.

The word lines 202a and 202b are each provided in common for the transistors 209a and 209b corresponding to the storage nodes 204a to 204h of the ferroelectric capacitors placed at positions offset from each other in the bit line direction.

The bit lines 203a to 203h run above the respective storage nodes 204a to 204h.

The bit line contacts 207 are placed under the respective bit lines 203a to 203h and between the adjacent plate lines 201a and 201b.

The plate lines 201a and 201b and the storage nodes 204a to 204h are made of a same material, and thus the machinable minimum spacing is the same. Therefore, the distance c1 between each pair of the storage nodes (204a and 204b), (204c and 204d), (204e and 204f) and (204g and 204h) adjacent to each other in the bit line direction is equal to the second inter-plate distance c1 in the first conventional example.

In the second embodiment, the line width b2 of the plate lines 201a and 202b including the storage nodes 204a to 204h arranged in two lines satisfies the relationship b2<2b1+c1.

Therefore, the length L2 of the ferroelectric memory cell 208 in the bit line direction satisfies the relationship:

$$L2=a1/2+b2+c1/2<a1/2+2b1+c1+c1/2.$$

The length of the ferroelectric memory cell 208 in the second embodiment in the word line direction is a half of the length W11 of the ferroelectric memory cell 18 in the first conventional example in the word line direction. Thus, the area S2 of the ferroelectric memory cell 208 in the second embodiment satisfies the relationship:

$$S2\ (a1/2+b2+c1/2)\times W11/2<(a1/2+21+c1+c1/2)\times W11/2<(a1/2+b1+c1/2)\times W11-(a1-c1)\times W11/4.$$

As described before, the area S11 of the ferroelectric memory cell 18 in the first conventional example satisfies S11=(a1/2+b1+c1/2)×W11, and the value of (a1−c1) is positive. This indicates that the area S2 of the ferroelectric memory cell 208 in the second embodiment is smaller than the area S11 of the ferroelectric memory cell 18 in the first conventional example.

(Third embodiment)

Hereinafter, a ferroelectric memory of the third embodiment will be described with reference to FIGS. 7 and 8.

Figure 7:
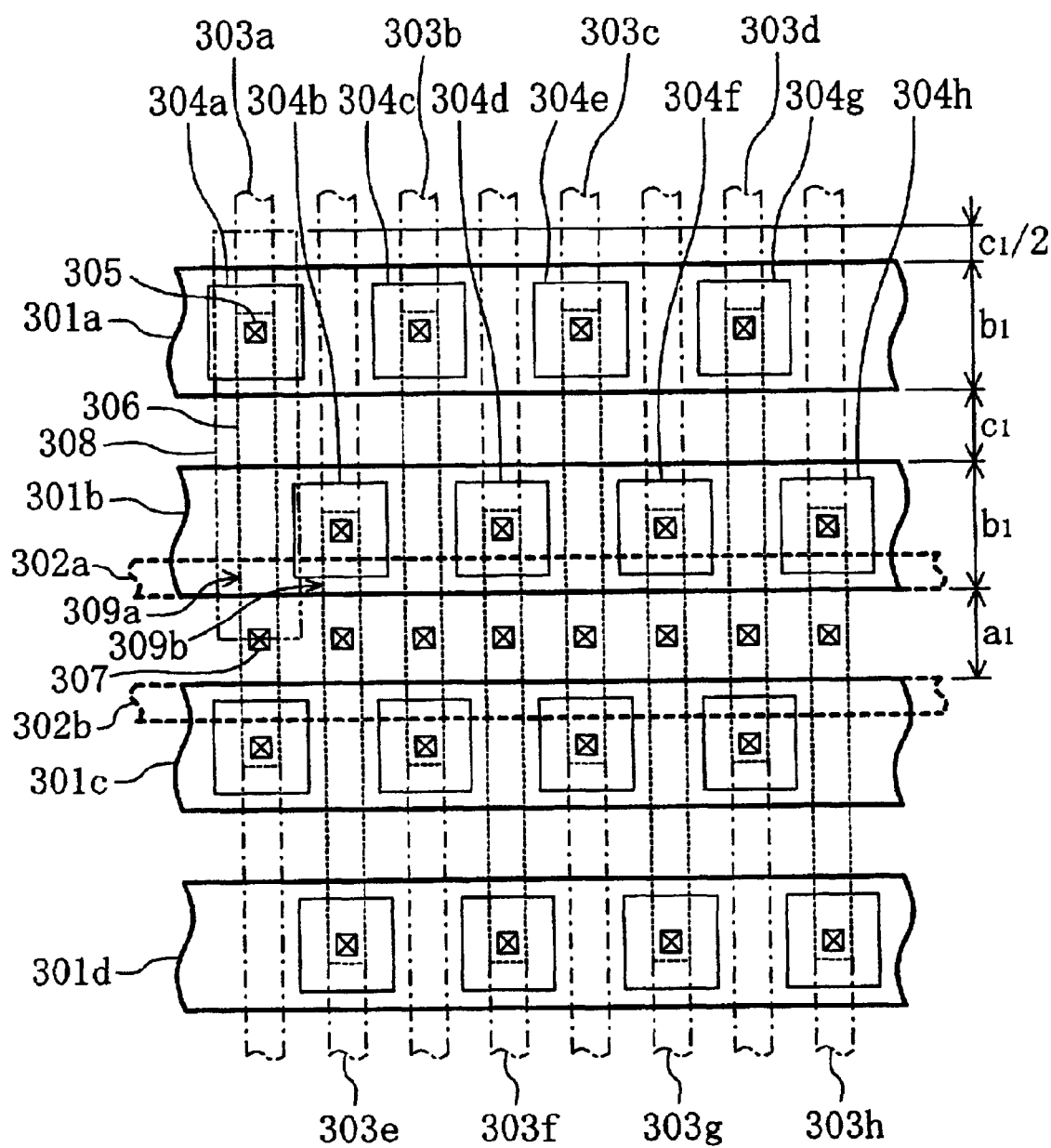
FIG. 7 is a layout of a ferroelectric memory of the third embodiment.
Figure 8:
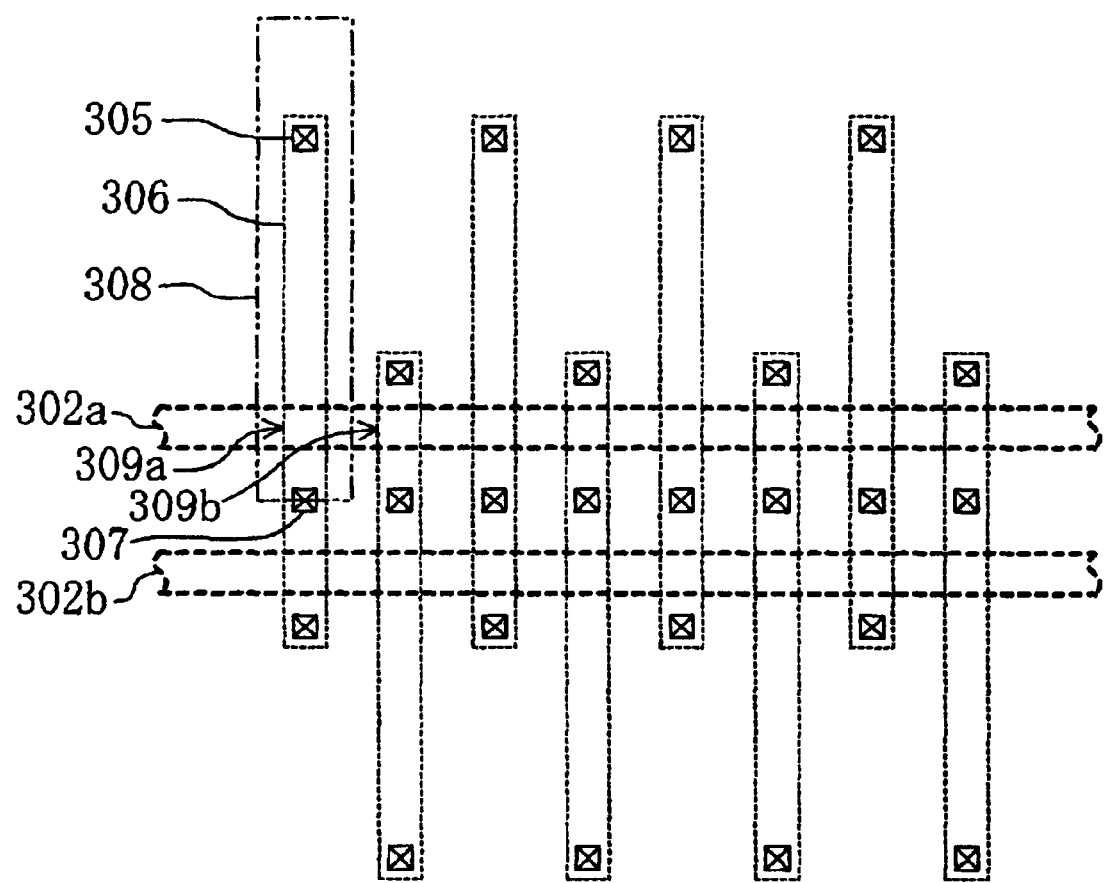
FIG. 8 is a layout of the ferroelectric memory of the third embodiment.

FIGS. 7 and 8 show a layout of a ferroelectric memory cell array in the third embodiment. Note that FIG. 8 is a view showing only active regions, word lines, bit line contacts and storage node contacts taken from the layout of FIG. 7.

Referring to FIGS. 7 and 8, the reference numerals 301a, 301b, 301c and 301d denote plate lines constructed of upper electrodes of ferroelectric capacitors. The reference numerals 302a and 302b denote word lines made of polycrystalline silicon constructed of gate electrodes of access transistors. The reference numerals 303a, 303b, 303c, 303d, 303e, 303f, 303g and 303h denote bit lines made of aluminum interconnections. The reference numerals 304a, 304b, 304c, 304d, 304e, 304f, 304g and 304h denote storage nodes of ferroelectric memory cells, each constructed of a lower electrode of the ferroelectric capacitor. The reference numeral 308 denotes a one-bit ferroelectric memory cell of the one-transistor one-capacitor type, and the reference numerals 309a and 309b denote transistors each constituting the ferroelectric memory cell 308. The reference numeral 305 denotes storage node contacts connecting the storage nodes 304a to 304h and active regions 306 of the transistors 309a and 309b, and the reference numeral 307 denotes bit line contacts connecting the bit lines 303a to 303h and the active regions 306 of the transistors 309a and 309b.

Referring to FIG. 7, the reference code al denotes the first inter-plate distance between the plate lines 301b and 301c with the bit line contacts 307 therebetween, b1 denotes the line width of the plate lines 301a to 301d including the storage nodes 304a to 304h, and c1 denotes the second interplate distance between the plate lines 301a and 301b without the bit line contacts 307 therebetween.

As shown in FIG. 7, the storage nodes (304a and 304b), (304c and 304d), (304e and 304f) and (304g and 304h) of the ferroelectric capacitors of respective pairs of the ferroelectric memory cells 308 adjacent to each other in the word line direction are placed at positions offset from each other in the bit line direction.

The length of the ferroelectric memory cell 308 in the word line direction is set at a half of that of the ferroelectric memory cell 18 in the first conventional example.

The word lines 302a and 302b are each provided in common for the transistors 309a and 309b corresponding to the storage nodes 304a to 304h of the pairs of the ferroelectric capacitors placed at positions offset from each other in the bit line direction.

The plate lines 301a and 301b are respectively placed for the sets of the storage nodes (304a, 304c, 304e and 304g) and (304b, 304d, 304f and 304h) in the same lines in the word line direction. That is, two plate lines 301a and 301b are provided for each of the word lines 302a and 302b.

In the third embodiment, the length L3 of the ferroelectric memory cell 308 in the bit line direction satisfies the relationship L3=(a1/2)+2b1+c1+(c1/2).

The length of the ferroelectric memory cell 308 in the third embodiment in the word line direction is a half of the length W11 of the ferroelectric memory cell 18 in the first conventional example in the word line direction. Thus, the area S3 of the ferroelectric memory cell 308 in the third embodiment satisfies the relationship:

$$S3=(a1/2+2b2+c1+c1/2)\times W11/2<(a1/2+b1+c1/2)\times W11-(a1-c1)W11/4.$$

As described before, the area S11 of the ferroelectric memory cell 18 in the first conventional example satisfies S11=(a1/2+b1+c1/2)×W11, and the value of (a1−c1) is positive. This indicates that the area S3 of the ferroelectric memory cell 308 in the third embodiment is smaller than the area S11 of the ferroelectric memory cell 18 in the first conventional example.

Moreover, in the third embodiment, only the plate line 301a is driven during data read/write from/in the ferroelectric memory cell 308. In this case, the bit lines 303a, 303b, 303c and 303d, which are not adjacent to each other, are connected to the plate line 301a via the word line 302a. The bit line 303a and the bit line 303e adjacent to the bit line 303a, for example, do not share the same plate line. Therefore, occurrence of a malfunction due to noise is prevented.

(Fourth embodiment)

Hereinafter, a ferroelectric memory of the fourth embodiment will be described with reference to FIGS. 9 and 10.

Figure 9:
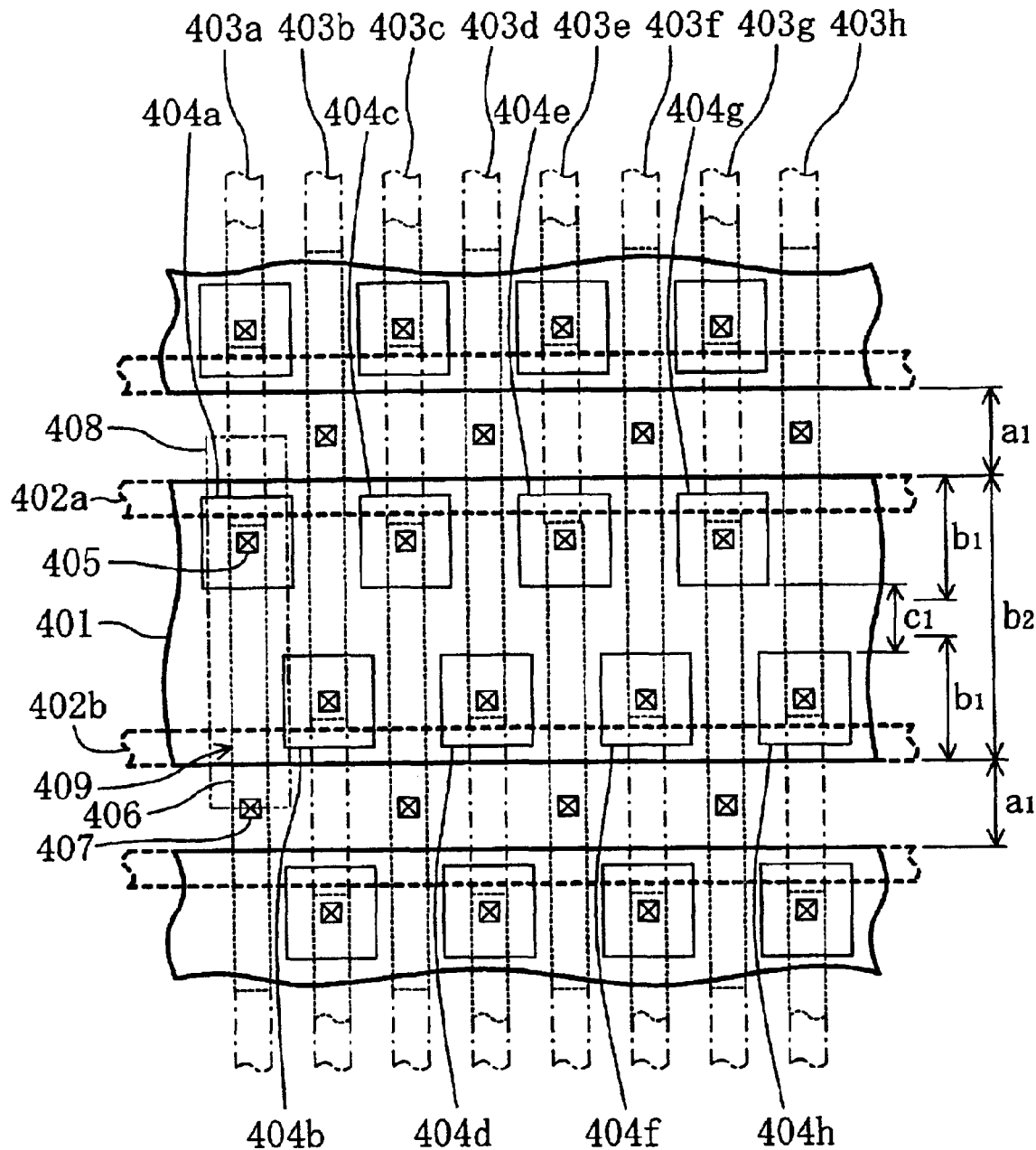
FIG. 9 is a layout of a ferroelectric memory of the fourth embodiment.
Figure 10:
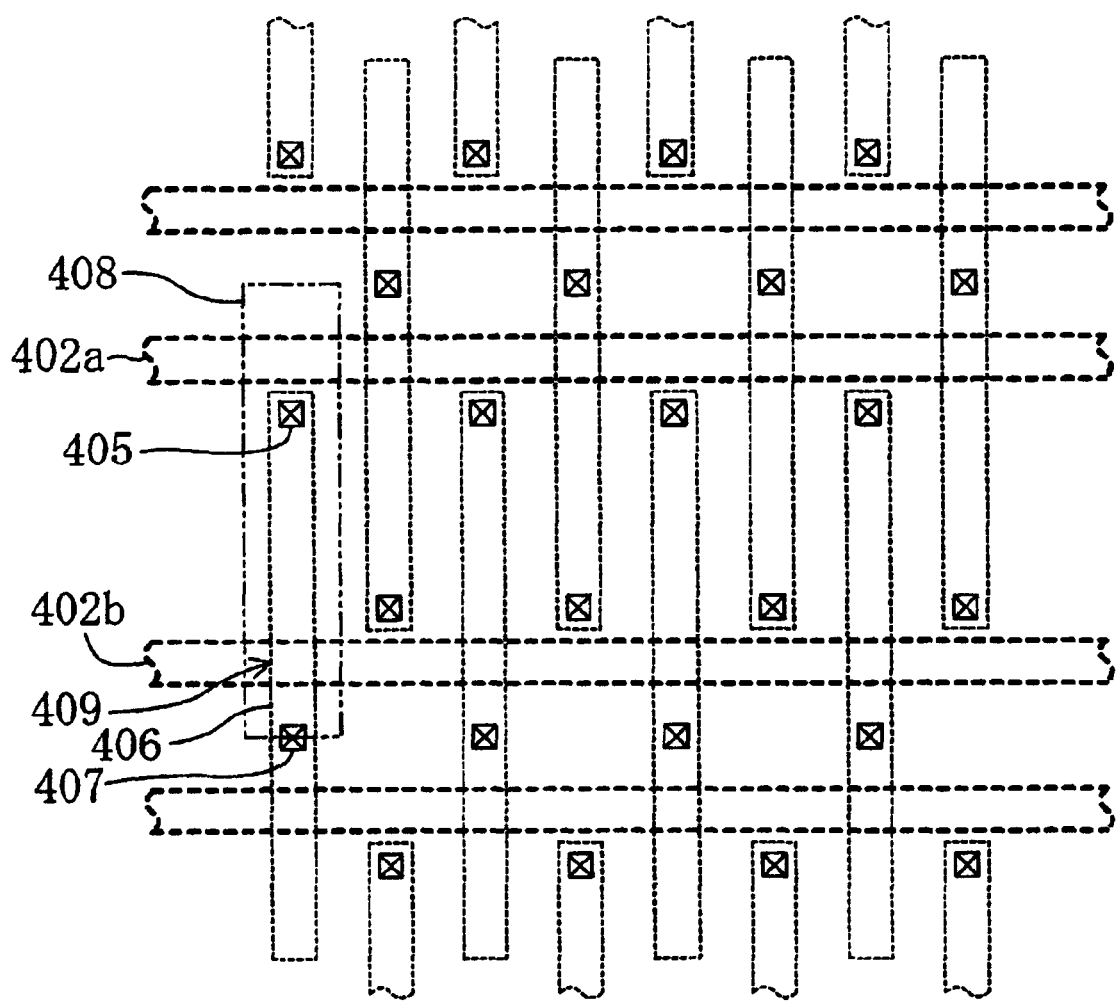
FIG. 10 is a layout of the ferroelectric memory of the fourth embodiment.

FIGS. 9 and 10 show a layout of a ferroelectric memory cell array in the fourth embodiment. Note that FIG. 10 is a view showing only active regions, word lines, bit line contacts and storage node contacts taken from the layout of FIG. 9.

Referring to FIGS. 9 and 10, the reference numeral 401 denotes a plate line constructed of upper electrodes of ferroelectric capacitors. The reference numerals 402a and 402b denote word lines made of polycrystalline silicon constructed of gate electrodes of access transistors. The reference numerals 403a, 403b, 403c, 403d, 403e, 403f, 403g and 403h denote bit lines made of aluminum interconnections. The reference numerals 404a, 404b, 404c, 404d, 404e, 404f, 404g and 404h denote storage nodes of ferroelectric memory cells, each constructed of a lower electrode of the ferroelectric capacitor. The reference numeral 408 denotes a one-bit ferroelectric memory cell of the one-transistor one-capacitor type, and the reference numeral 409 denotes a transistor constituting the ferroelectric memory cell 408. The reference numeral 405 denotes storage node contacts connecting the storage nodes 404a to 404h and active regions 406 of the transistors 409, and the reference numeral 407 denotes bit line contacts connecting the bit lines 403a to 403h and the active regions 406 of the transistors 409.

Referring to FIG. 9, the reference code a1 denotes the distance between the adjacent plate lines 401 with the bit line contacts 407 therebetween, b1 denotes the line width of the plate lines 11a and 11b including the storage nodes in the first conventional example, b2 denotes the line width of the plate line 401a, 402b including the storage nodes 404a to 404h arranged in two lines, and c1 denotes the distance between each pair of the storage nodes (404a and 404b), (404c and 404d), (404e and 404f) and (404g and 404h) adjacent to each other in the bit line direction.

As shown in FIG. 9, the storage nodes (404a and 404b), (404c and 404d), (404e and 404f) and (404g and 404h) of the ferroelectric capacitors of respective pairs of the ferroelectric memory cells 408 adjacent to each other in the word line direction are placed at positions offset from each other in the bit line direction.

The length of the ferroelectric memory cell 408 in the word line direction is set at a half of that of the ferroelectric memory cell 18 in the first conventional example.

The plate line 401 is provided in common for the storage nodes 404a to 404h of the ferroelectric capacitors of the pairs of the memory cells placed at positions offset from each other in the bit line direction.

The word lines 402a and 402b are respectively provided for the sets of the storage nodes (404a, 404c, 404e and 404g) and (404b, 404d, 404f and 404h) in the same lines in the word line direction. That is, one plate line 401 is provided for the two word lines 402a and 402b.

The bit lines 403a to 403h run above the respective storage nodes 404a to 404h.

The bit line contacts 407 are placed under the bit lines 403a to 403h and between the adjacent plate lines 401.

The plate line 401 and the storage nodes 404a to 404h are made of a same material, and thus the machinable minimum spacing is the same. Therefore, the distance c1 between each pair of the storage nodes (404a and 404b), (404c and 404d), (404e and 404f) and (404g and 404h) adjacent to each other in the bit line direction is equal to the second inter-plate distance c1 in the first conventional example.

In the fourth embodiment, the line width b2 of the plate line 401 including the storage nodes 404a to 404h arranged in two lines satisfies the relationship b2<2b1+c1.

Therefore, the length L4 of the ferroelectric memory cell 408 in the bit line direction satisfies the relationship L4=a1+b2<a1+2b1+c1.

The length of the ferroelectric memory cell 408 in the fourth embodiment in the word line direction is a half of the length W11 of the ferroelectric memory cell 18 in the first conventional example in the word line direction. Also, as described before, the area S11 of the ferroelectric memory cell 18 in the first conventional example satisfies S11=(a1/2+b1+c1/2)×W11. Thus, the area S4 of the ferroelectric memory cell 408 in the fourth embodiment satisfies the relationship:

$$S4=(a1+2b1)\times W11/2<(a1+2b1+c1)\times W11/2<(a1/2+b1+c1/2)\times W11=S11.$$

Therefore, the area S4 of the ferroelectric memory cell 408 in the fourth embodiment is smaller than the area S11 of the ferroelectric memory cell 18 in the first conventional example.

(Modification of the fourth embodiment)

Figure 11:
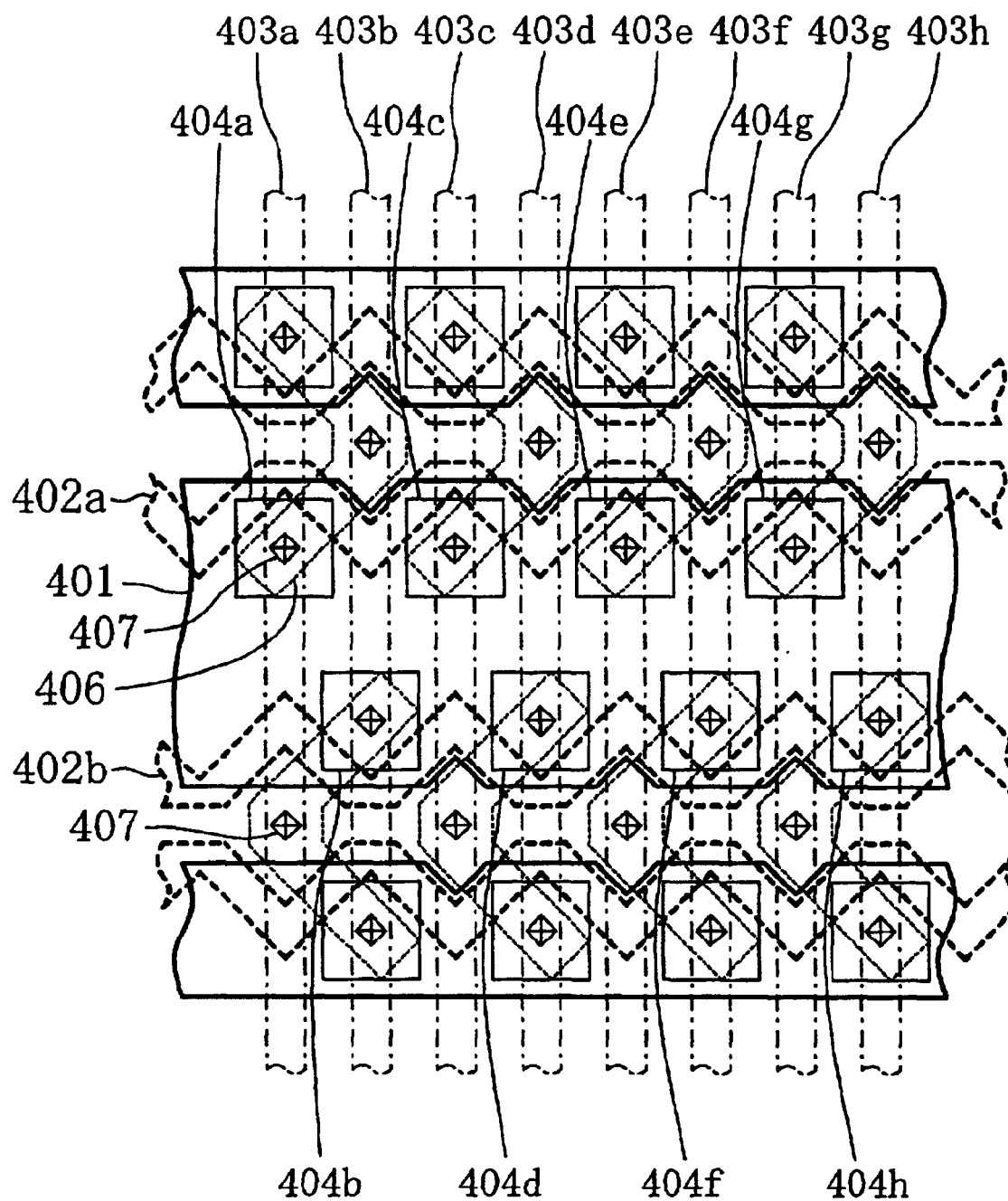
FIG. 11 is a layout of a ferroelectric memory of a modification of the fourth embodiment.

FIG. 11 shows a layout of a ferroelectric memory cell array of a modification of the fourth embodiment.

In this modification, as in the first embodiment, cut portions are formed at positions of the plate line 401 near the bit line contacts 407, and the word lines 402a and 402b run in a zigzag fashion navigating around the storage node contacts 405 and the bit line contacts 407. The active regions 406 are formed in an L shape, connecting a pair of the storage node contacts 405 adjacent to each other in the bit line direction and the bit line contact 407 adjacent to the paired storage node contacts 105.

(Fifth embodiment)

Hereinafter, a ferroelectric memory of the fifth embodiment will be described with reference to FIGS. 12, 13 and 14.

Figure 12:
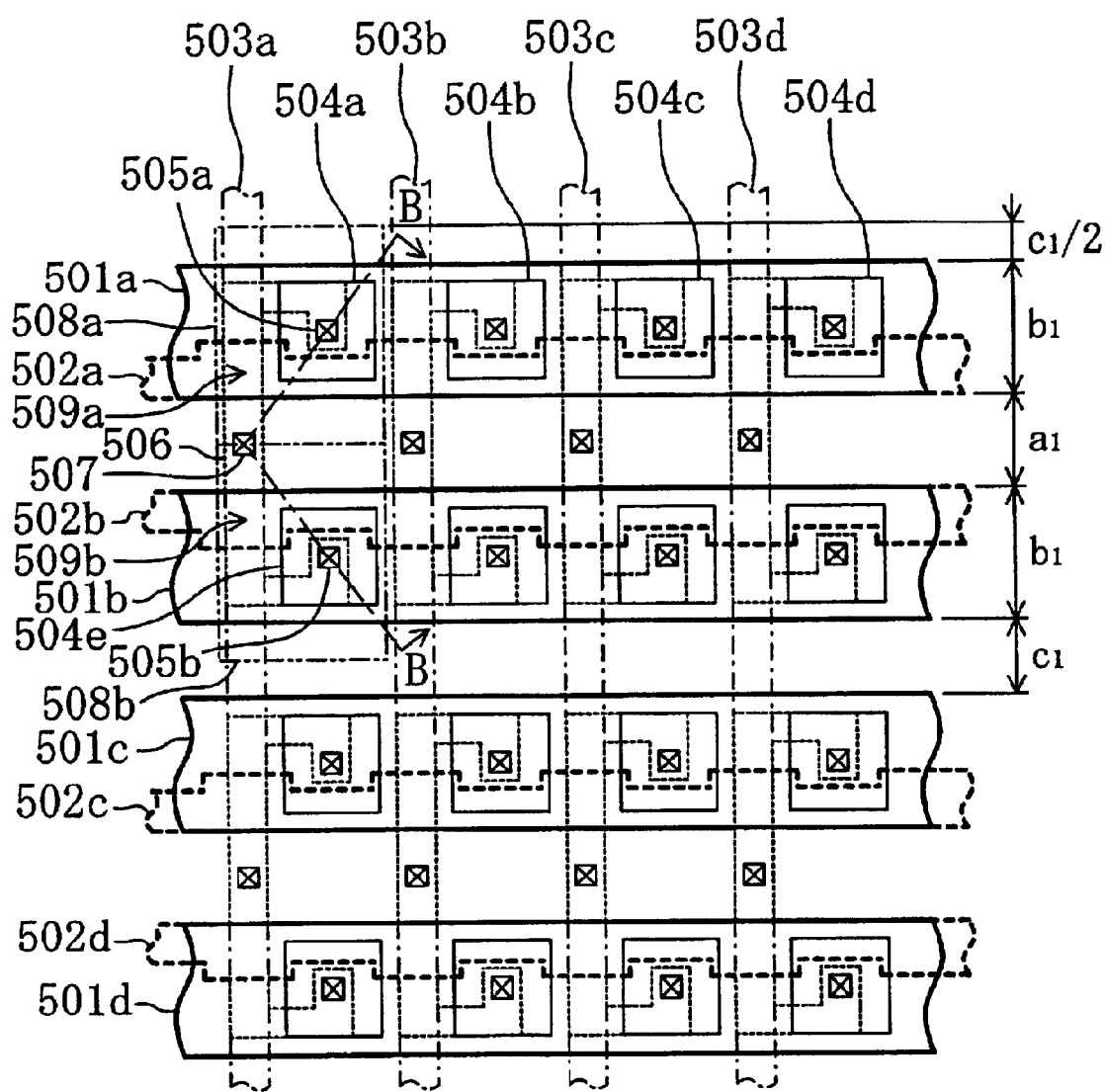
FIG. 12 is a layout of a ferroelectric memory of the fifth embodiment.
Figure 13:
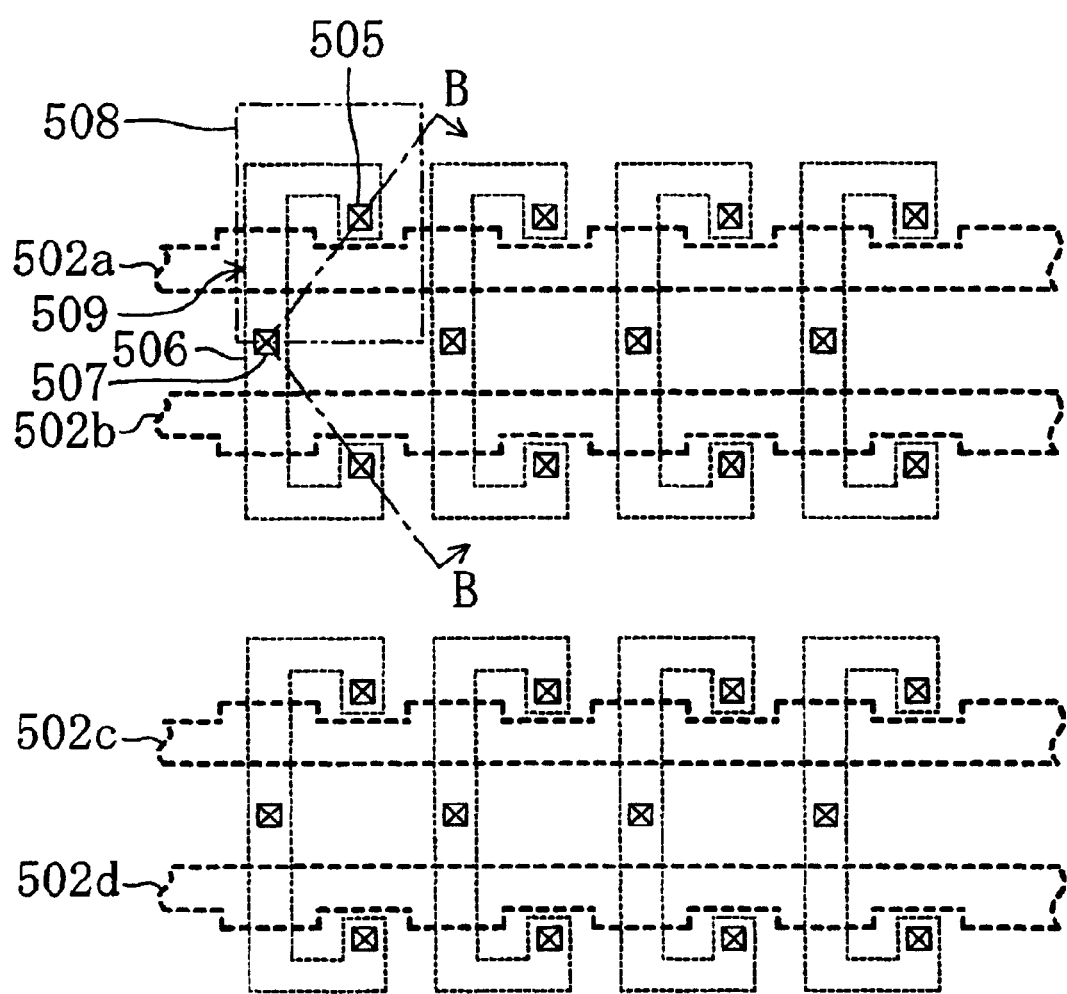
FIG. 13 is a layout of the ferroelectric memory of the fifth embodiment.
Figure 14:
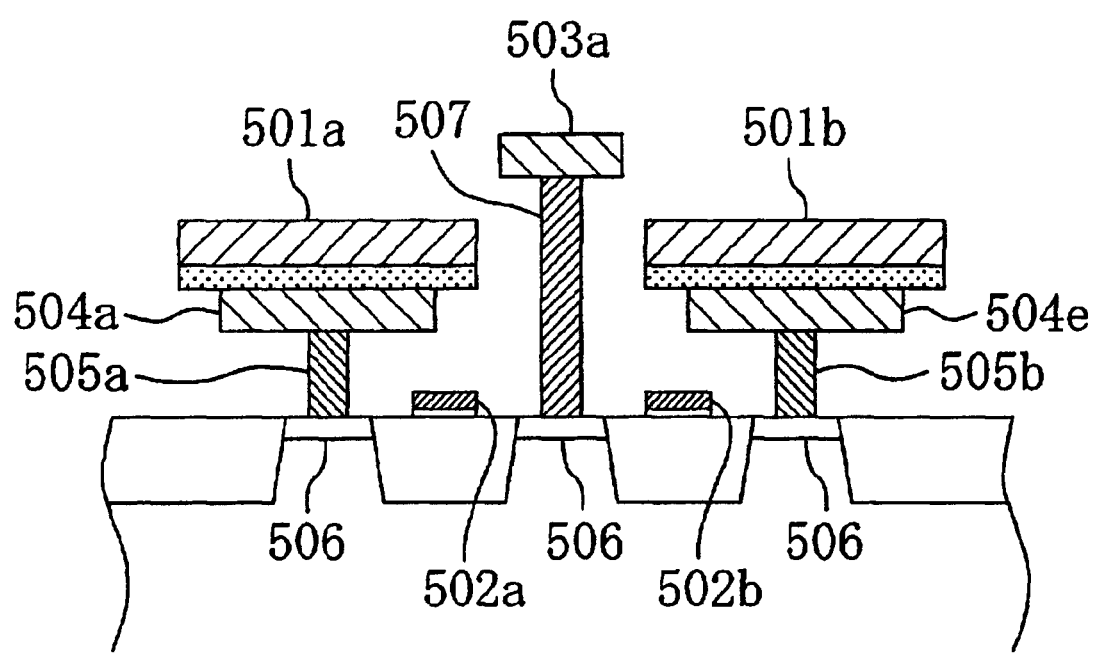
FIG. 14 is a cross-sectional view of the ferroelectric memory of the fifth embodiment, taken long line B—B of FIGS. 13 and 14.

FIGS. 12 and 13 show a layout of a ferroelectric memory cell array in the fifth embodiment, and FIG. 14 shows a cross-sectional structure taken along line B—B of FIGS. 12 and 13. Note that FIG. 13 is a view showing only active regions, word lines, bit line contacts and storage node contacts taken from the layout of FIG. 12.

Referring to FIGS. 12, 13 and 14, the reference numerals 501a, 501b, 501c and 501d denote plate lines constructed of upper electrodes of ferroelectric capacitors. The reference numerals 502a, 502b, 502c and 502d denote word lines made of polycrystalline silicon constructed of gate electrodes of access transistors. The reference numerals 503a, 503b, 503c and 503d denote bit lines made of aluminum interconnections. The reference numerals 504a, 504b, 504c and 504d denote storage nodes of ferroelectric memory cells, each constructed of a lower electrode of the ferroelectric capacitor. The reference numeral 508 denotes a one-bit ferroelectric memory cell of the one-transistor one-capacitor type, and the reference numeral 509 denotes a transistor constituting the ferroelectric memory cell 508. The reference numeral 505 denotes storage node contacts connecting the storage nodes 504a to 504d and active regions 506 of the transistors 509, and the reference numeral 507 denotes bit line contacts connecting the bit lines 503a to 503d and the active regions 506 of the transistors 509.

Referring to FIG. 12, the reference code a1 denotes the first inter-plate distance between the adjacent plate lines 501a and 501b with the bit line contacts 507 therebetween, b1 denotes the line width of the plate lines 501a to 501d each including the storage nodes 504a to 504d, and c1 denotes the second inter-plate distance between the adjacent plate lines 501b and 501c without the bit line contacts 507 therebetween.

As shown in FIG. 12, the plate lines 501a to 501d run in the word line direction above the storage nodes 504a to 504d of the ferroelectric memory cells adjacent to each other in the word line direction.

The bit lines 503a to 503d run between the storage nodes 504a to 504d of the ferroelectric memory cells adjacent to each other in the word line direction.

The bit line contacts 507 are placed at positions under the bit lines 503a to 503d and between the plate lines (501a and 501b) and (501c and 501d) adjacent in the bit line direction.

The active regions 506 of the transistors 509a and 509b extend from a pair of the storage node contacts 505a and 505b in the directions away from each other, turn toward the bit line 503a, and then extend under the bit line 503a, that is, extend through between the storage nodes.

Each of the word lines 502a to 502d has: gate electrodes having a comparatively large width formed above portions of the active regions 506 extending through between the storage nodes 504a to 504d in the bit line direction; and interconnections having a comparatively small width formed near the storage nodes 504a to 504d.

In the fifth embodiment, in which each of the word lines 502a to 502d has: gate electrodes having a comparatively large width formed above portions of the active regions 506 extending through between the storage nodes 504a to 504d in the bit line direction; and interconnections having a comparatively small width formed near the storage nodes 504a to 504d, it is possible e to form the word lines 502a to 502d so that they do not protrude from the plate lines 501a to 501d even when the gate length of the transistor 509 is the same as that of the transistor 29 in the second conventional example.

The length L5 of the ferroelectric memory cell 508 of the fifth embodiment in the bit line direction satisfies L5=a1/2+b1+c1/2.

The length L12 of the ferroelectric memory cell 28 in the second conventional example in the bit line direction satisfies L12=d+e+f+b1/2+c1/2. Therefore, L12−L5=(d+e+f)−(a1/2+b1/2).

Since d+e+f=a2/2+b1/2>a1/2+b1/2 as described before, L12>L5.

Therefore, the area of the ferroelectric memory cell 508 in the fifth embodiment is smaller than the area of the ferroelectric memory cell 28 in the second conventional example.

As the gate length (=e) of the transistor 509 is greater, the difference between the area of the ferroelectric memory cell 508 in the fifth embodiment and the area of the ferroelectric memory cell 28 in the second conventional example is greater.

(Sixth embodiment)

Hereinafter, a ferroelectric memory of the sixth embodiment will be described with reference to FIGS. 15, 16 and 17.

Figure 15:
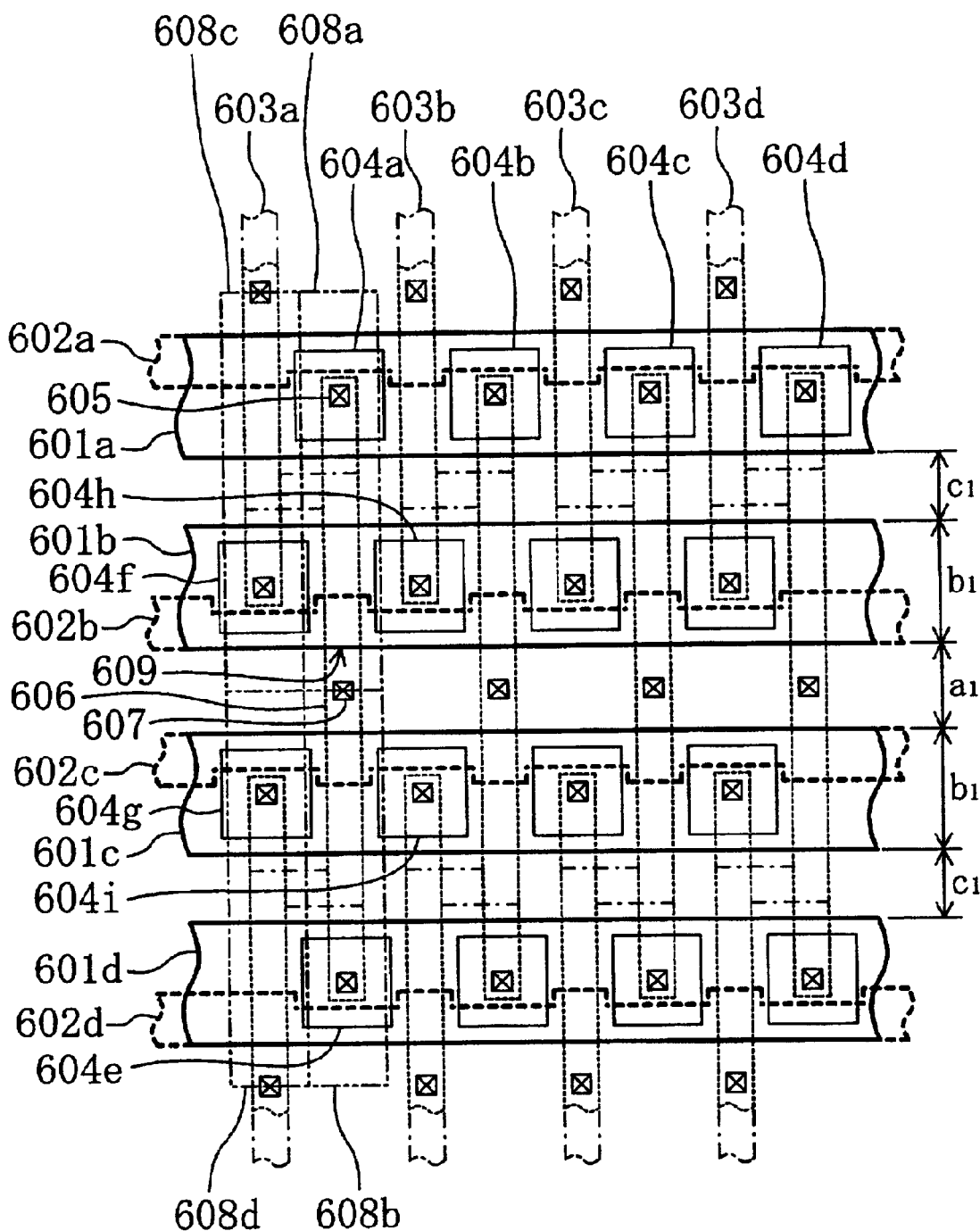
FIG. 15 is a layout of a ferroelectric memory of the sixth embodiment.
Figure 16:
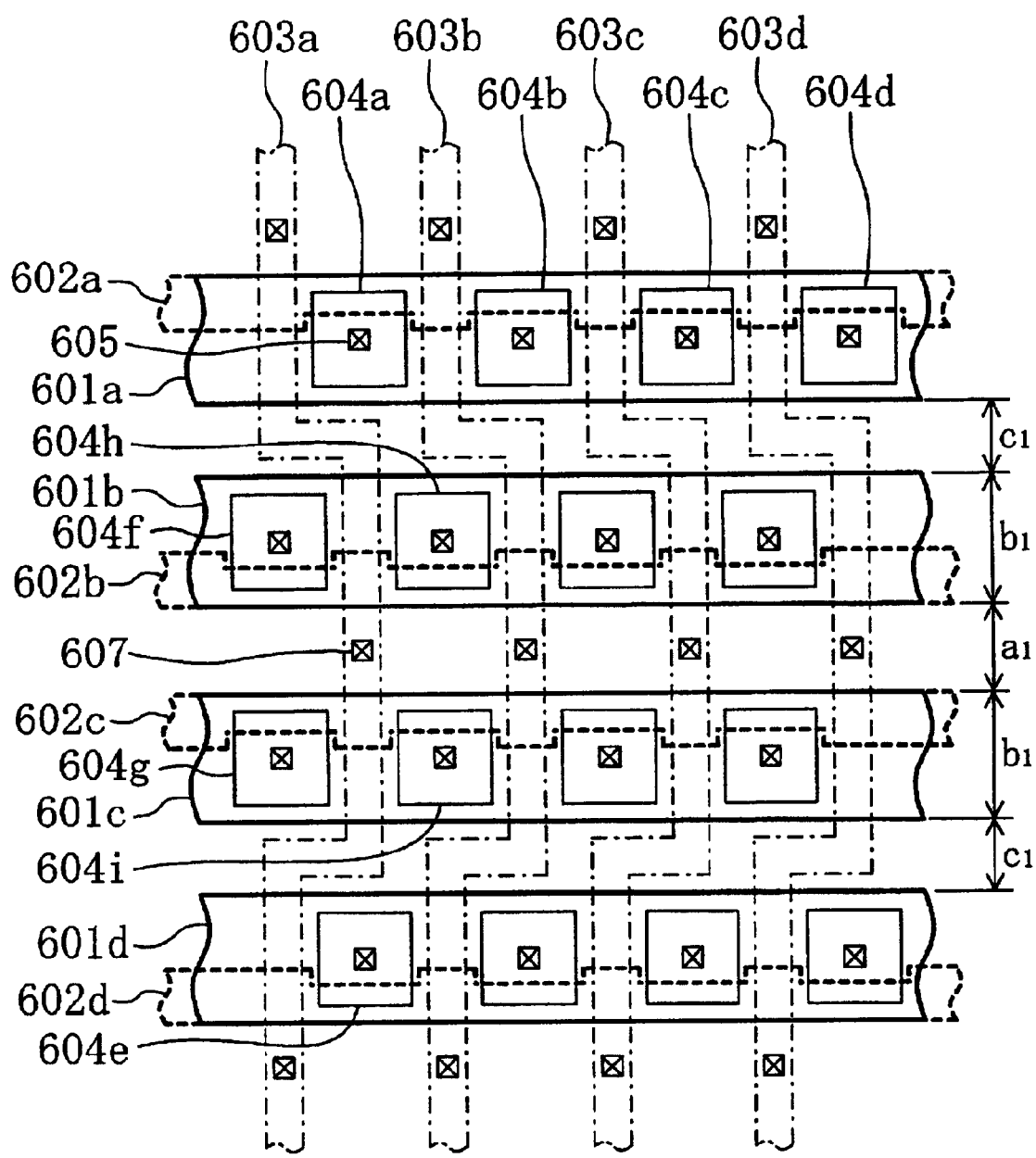
FIG. 16 is a layout of the ferroelectric memory of the sixth embodiment.
Figure 17:
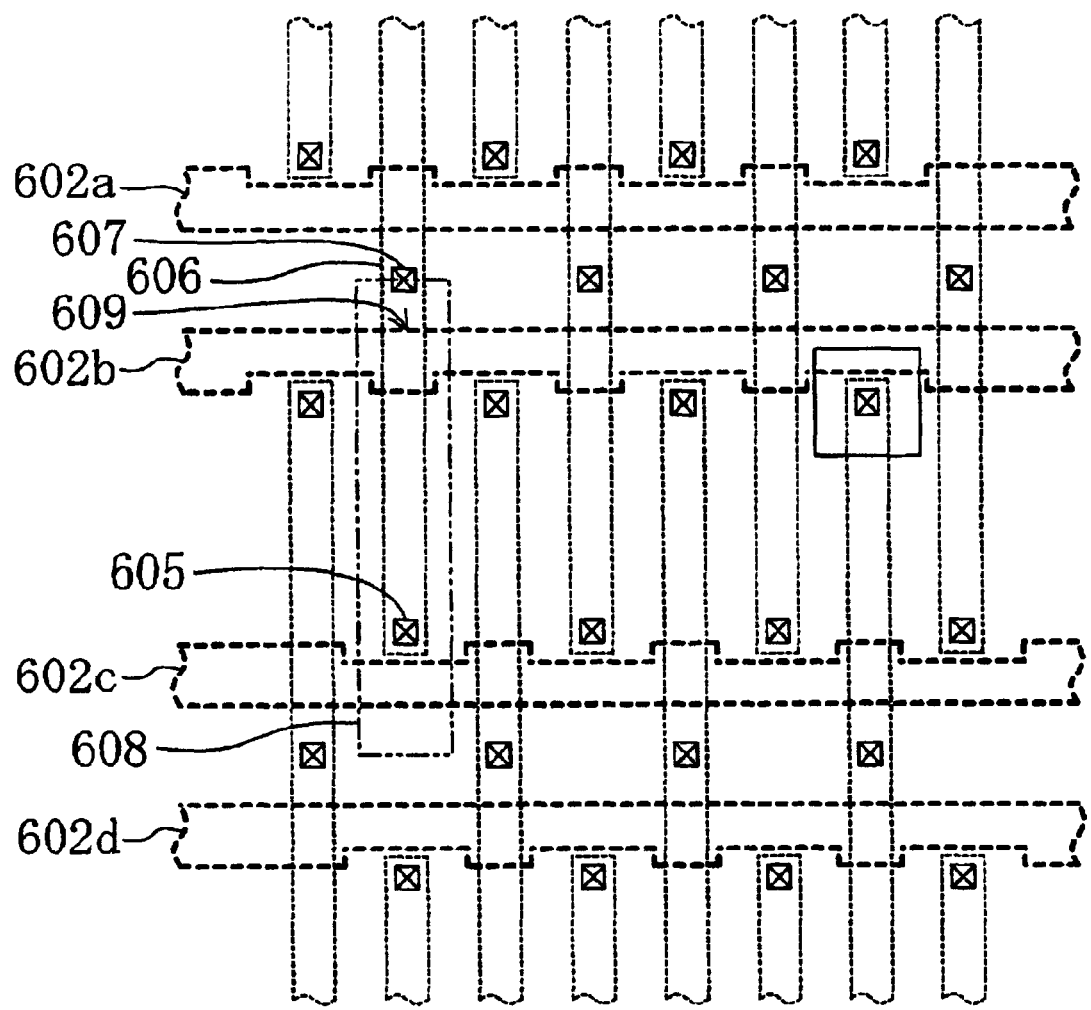
FIG. 17 is a layout of the ferroelectric memory of the sixth embodiment.

FIGS. 15 to 17 show a layout of a ferroelectric memory cell array in the sixth embodiment. Note that FIG. 16 is a view showing only plate lines, word lines, bit lines, storage nodes and bit line contacts taken from the layout of FIG. 15, and FIG. 17 is a view showing only active regions, word lines, bit line contacts and storage node contacts taken from the layout of FIG. 15.

Referring to FIGS. 15 to 17, the reference numerals 601a, 601b, 601c and 601d denote plate lines constructed of upper electrodes of ferroelectric capacitors. The reference numerals 602a, 602b, 602c and 602d denote word lines made of polycrystalline silicon constructed of gate electrodes of access transistors. The reference numerals 603a, 603b, 603c and 603d denote bit lines made of aluminum interconnections. The reference numerals 604a, 604b, 604c and 604d denote storage nodes of ferroelectric memory cells, each constructed of a lower electrode of the ferroelectric capacitor. The reference numeral 608 denotes a one-bit ferroelectric memory cell of the one-transistor one-capacitor type, and the reference numeral 609 denotes a transistor constituting the ferroelectric memory cell 608. The reference numeral 605 denotes a storage node contact connecting the storage node 604a and an active region 606 of the transistor 609, and the reference numeral 607 denotes a bit line contact connecting the bit line 603a and the active region 606 of the transistor 609.

Referring to FIGS. 15 and 16, the reference code a1 denotes the first inter-plate distance between the adjacent plate lines (601a and 601b) and (601c and 601d) with the bit line contacts 607 therebetween, b1 denotes the line width of the plate lines 601a to 601d each including the storage nodes 604a to 604d, and c1 denotes the second inter-plate distance between the adjacent plate lines 601b and 601c without the bit line contacts 607 therebetween.

As shown in FIG. 15, the storage nodes of the ferroelectric capacitors of the ferroelectric memory cells (608a and 608b) adjacent to each other in the bit line direction via the bit line contact 607 (the storage node 604a in the first line and the storage node 604e in the fourth line) are placed not to be offset from each other in the word line direction (to be aligned in the bit line direction). On the contrary, the storage nodes of the ferroelectric capacitors of the ferroelectric memory cells (608a and 608c, or 608b and 608d) sharing the common bit line without the bit line contact 607 therebetween and located adjacent to each other (the storage node 604a in the first line and the storage node 604f in the second line, or the storage node 604g in the third line and the storage node 608b in the fourth line) are placed at positions offset from each other in the word line direction.

The length of the ferroelectric memory cell 608 in the word line direction is set at a half of that of the ferroelectric memory cell 28 of the second conventional example.

The bit line 603a runs in the bit line direction, turns at a position between the ferroelectric memory cells (608a and 608c) sharing the common bit line without the bit line contact 607 therebetween and located adjacent to each other to proceed in the word line direction, then runs in the bit line direction between the storage nodes of the ferroelectric capacitors of the memory cells (608a and 608b) adjacent to each other in the bit line direction via the bit line contact 607 (the storage node 604a in the first line and the storage node 608b in the fourth line), turns at a position between the storage nodes of the ferroelectric capacitors of the memory cells (608b and 608d) sharing the common bit line without the bit line contact 607 therebetween and located adjacent to each other (the storage node 604g in the third line and the storage node 608b in the fourth line) to proceed in the word line direction, and then runs in the bit line direction.

The active regions 606 extend between the pair of the storage nodes sharing the bit line contact 607 and placed not to be offset from each other in the word line direction (the storage nodes in the first line and in the fourth line).

Therefore, the word line 602b is operated when the plate line 601a is driven, while the word line 602a is operated when the plate line 601b is driven.

Each of the word lines 602a to 602d has: gate electrodes having a comparatively large width formed above the active regions 606; and interconnections having a comparatively small width formed near the storage nodes 604a to 604d.

In the sixth embodiment, in which the word line 602b has: gate electrodes having a comparatively large width formed above the active regions 606; and interconnections having a comparatively small width formed near the storage nodes 604a to 604d, it is possible to have the gate length of the transistor 609 equal to that of the transistor 29 in the second conventional example only at the positions above the active regions 606.

The length L6 of the ferroelectric memory cell 608 in the sixth embodiment in the bit line direction satisfies L6=a1+2b1+c1.

The length of the ferroelectric memory cell 608 in the sixth embodiment in the word line direction is a half of the length W12 of the ferroelectric memory cell 28 in the second conventional example in the word line direction. Therefore, the area S6 of the ferroelectric memory cell 608 in the sixth embodiment satisfies $$S6=(a1+2b1+c1)\times W12/2=(a1/2+b1+c1/2)\times W12.$$

The area S12 of the ferroelectric memory cell 28 in the second conventional example satisfies S12=(d+e+f+b1/2+c1/2)×W12.

Therefore, S12−S6={(d+e+f)−(a1/2+b1/2)}×W12.

As described in relation with the problems of the second conventional example, d+e+f=a2/2+b1/2>a1/2+b1/2. Therefore, S12>S6.

Thus, the area of the ferroelectric memory cell 608 in the sixth embodiment can be made smaller than the area of the ferroelectric memory cell 28 in the second conventional example.

As the gate length (=e) of the transistor 609 is greater, the difference between the area S6 of the ferroelectric memory cell 608 in the sixth embodiment and the area S12 of the ferroelectric memory cell 28 in the second conventional example is greater.

(Seventh embodiment)

Hereinafter, a ferroelectric memory of the seventh embodiment will be described with reference to FIGS. 18 and 19.

Figure 18:
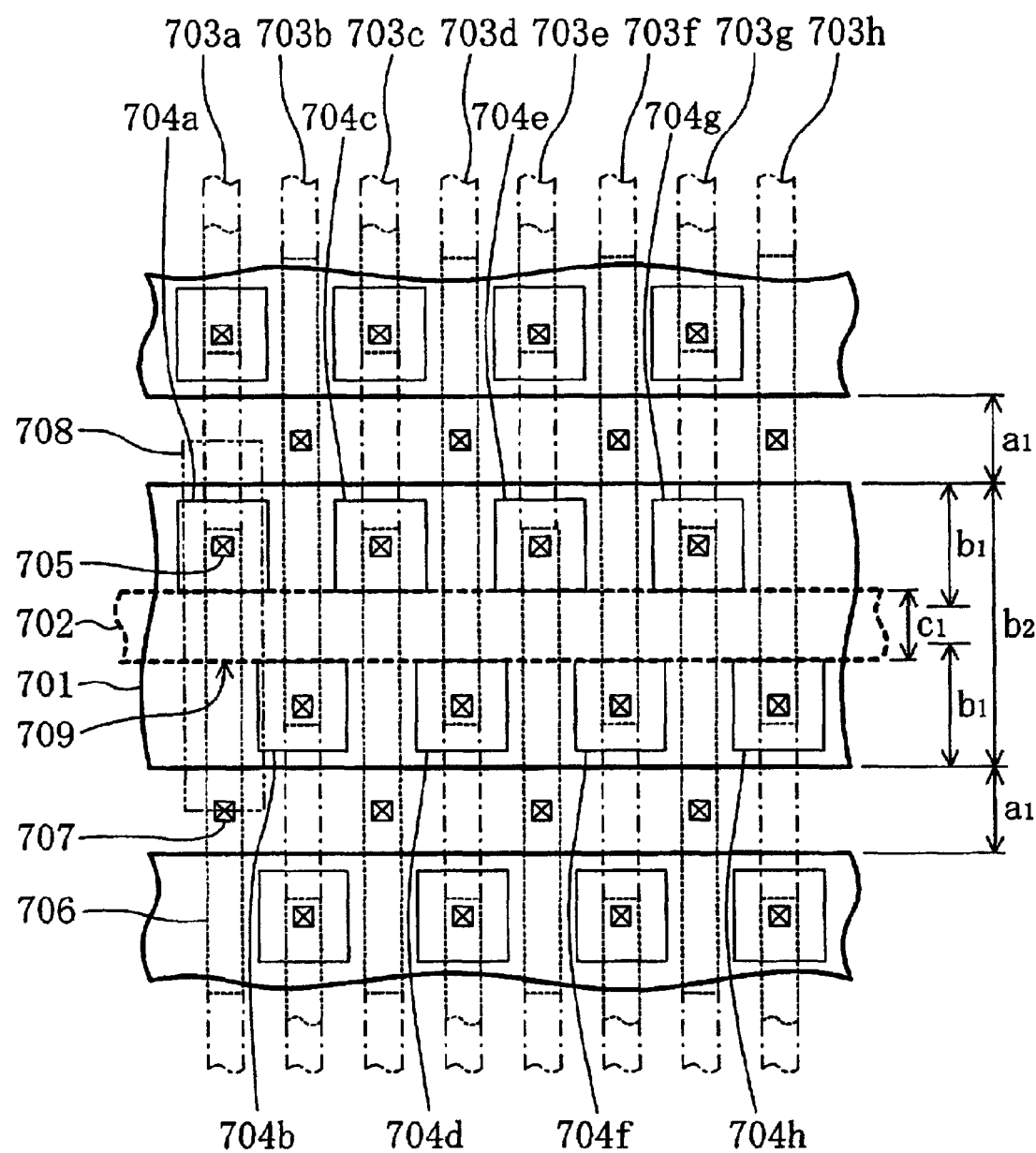
FIG. 18 is a layout of a ferroelectric memory of the seventh embodiment.
Figure 19:
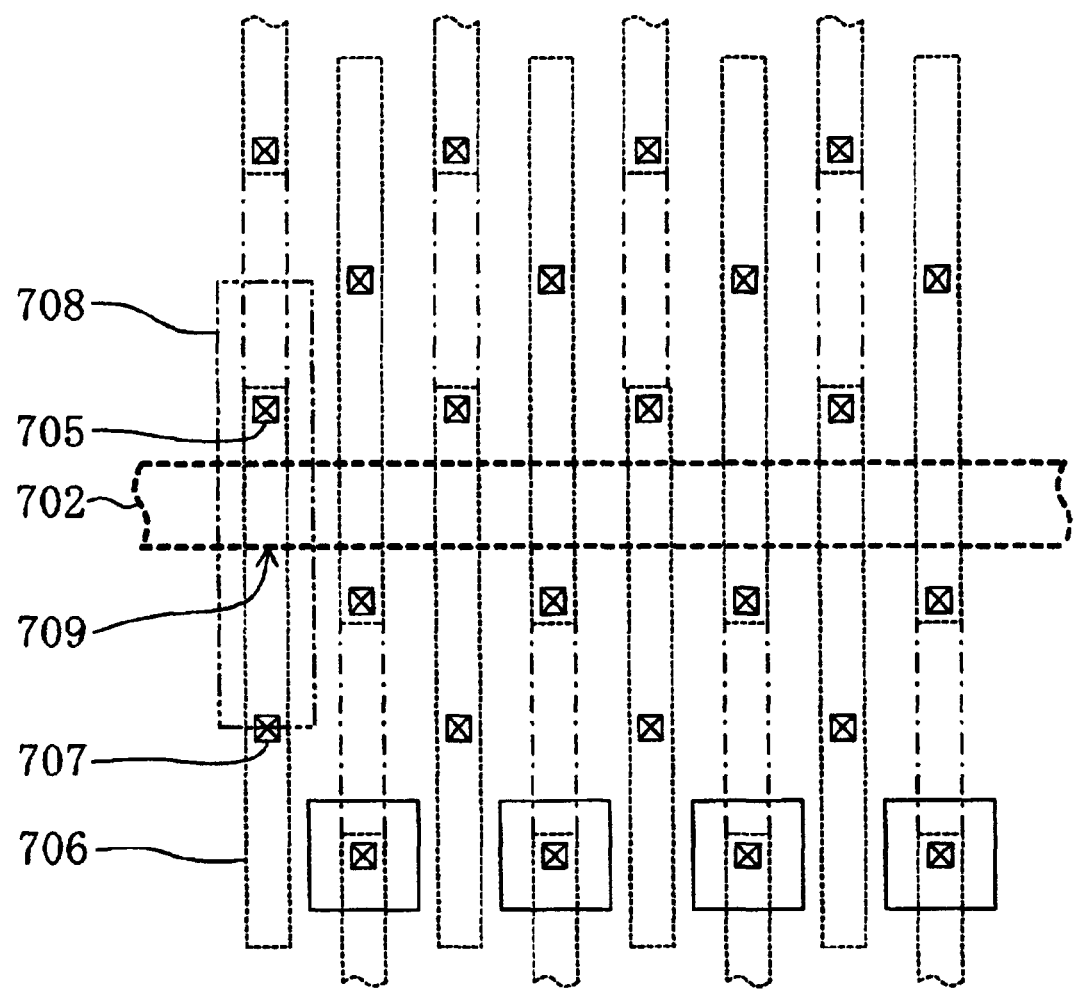
FIG. 19 is a layout of the ferroelectric memory of the seventh embodiment.

FIGS. 18 and 19 show a layout of a ferroelectric memory cell array in the sixth embodiment. Note that FIG. 19 is a view showing only active regions, word lines, bit line contacts and storage node contacts taken from the layout of FIG. 18.

Referring to FIGS. 18 and 19, the reference numeral 701 denotes a plate line constructed of upper electrodes of ferroelectric capacitors. The reference numeral 702 denotes a word line made of polycrystalline silicon constructed of gate electrodes of access transistors. The reference numerals 703a, 703b, 703c, 703d, 703e, 703f, 703g and 703h denote bit lines made of aluminum interconnections. The reference numerals 704a, 704b, 704c, 704d, 704e, 704f, 704g and 704h denote storage nodes of ferroelectric memory cells, each constructed of a lower electrode of the ferroelectric capacitor. The reference numeral 708 denotes a one-bit ferroelectric memory cell of the one-transistor one-capacitor type, and the reference numeral 709 denotes a transistor constituting the ferroelectric memory cell 708. The reference numeral 705 denotes storage node contacts connecting the storage nodes 704a to 704h and active regions 706 of the transistors 709, and the reference numeral 707 denotes bit line contacts connecting the bit lines 703a to 703h and the active regions 706 of the transistors 709.

Referring to FIG. 18, the reference code a1 denotes the distance between the adjacent plate lines 701 with the bit line contacts 707 therebetween, b1 denotes the line width of the plate lines 21a and 21b including the storage nodes in the second conventional example, b2 denotes the line width of the plate line 701 including the storage nodes 704a to 704h arranged in two lines, and c1 denotes the distance between the adjacent plate lines 21b and 21c without the bit line contacts 27 therebetween in the second conventional example.

As shown in FIG. 18, the plate line 701 is provided in common for the storage nodes 704a to 704h of the ferroelectric capacitors in two lines (for example, the storage nodes 704a, 704c, 704e and 704g in the second line, and the storage nodes 704b, 704d, 704f and 704h in the third line).

Among the storage nodes 704a to 704h of the ferroelectric capacitors in two lines sharing the plate line 701, the storage nodes 704a, 704c, 704e and 704g in one line (for example, the second line) are placed at positions offset from the storage nodes 704b, 704d, 704f and 704h in the other line (for example, the third line) in the bit line direction.

The length of the ferroelectric memory cell 708 in the word line direction is set at a half of that of the ferroelectric memory cell 28 of the second conventional example in the word line direction.

The word line 702 runs through between the two lines of the storage nodes sharing the plate line 701 (for example, between the storage nodes 704a, 704c, 704e and 704g in the second line and the storage nodes 704b, 704d, 704f and 704h in the third line), and is provided in common for the transistors 709 corresponding to the ferroelectric capacitors in the two lines sharing the plate line 701.

The bit lines 703a to 703h are provided for the respective ferroelectric capacitors in the two lines sharing the plate line 701. The bit line contacts 707 are placed at positions under the bit lines 703a to 703d and between the adjacent plate lines 701.

The plate line 701 and the storage nodes 704a to 704h are made of a same material, and thus the machinable minimum spacing is the same. Therefore, the distance c1 between the storage nodes 704a, 704c, 704e and 704g in one line (for example, the second line) and the storage nodes 704b, 704d, 704f and 704h in the other line (for example, the third line) among the storage nodes 704a to 704h of the ferroelectric capacitors in two lines sharing the plate line 701 is equal to the second inter-plate distance c1 in the second conventional example.

The line width of the word line 702, that is, the gate length of the transistor 709 can be set to be roughly the same as the distance between the storage nodes 704a, 704c, 704e and 704g in one line (for example, the second line) and the storage nodes 704b, 704d, 704f and 704h in the other line (for example, the third line) among the storage nodes 704a to 704h of the ferroelectric capacitors in two lines sharing the plate line 701. Therefore, the area of the ferroelectric memory cell 708 does not depend on the gate length of the transistor 709. Thus, it is possible e to increase the gate length of the transistor 709 without influencing the area of the ferroelectric memory cell 708.

In the seventh embodiment, the line width b2 of the plate line 701 including the storage nodes 704a to 704h in two lines satisfies the relationship b2<2b1+c1.

Therefore, the length L7 of the ferroelectric memory cell 708 in the bit line direction satisfies the relationship L7=a1+b2<a1+2b1+c1.

The length of the ferroelectric memory cell 708 in the seventh embodiment in the word line direction is set at a half of the length W12 of the ferroelectric memory cell 28 in the second conventional example in the word line direction. Thus, when the area of the ferroelectric memory cell 28 is denoted by S12, the area S7 of the ferroelectric memory cell 708 in the seventh embodiment satisfies the relationship:

$$S7=(a1+b2)\times W12/2<(a1+2b1+c1)\times W12/2<(a1/2+b1+c1/2)\times W12=S12.$$

Therefore, the area of the ferroelectric memory cell 708 in the seventh embodiment can be smaller than the area of the ferroelectric memory cell 28 in the second conventional example.

(Eighth embodiment)

Hereinafter, a ferroelectric memory of the eighth embodiment will be described with reference to FIGS. 20 and 21.

Figure 20:
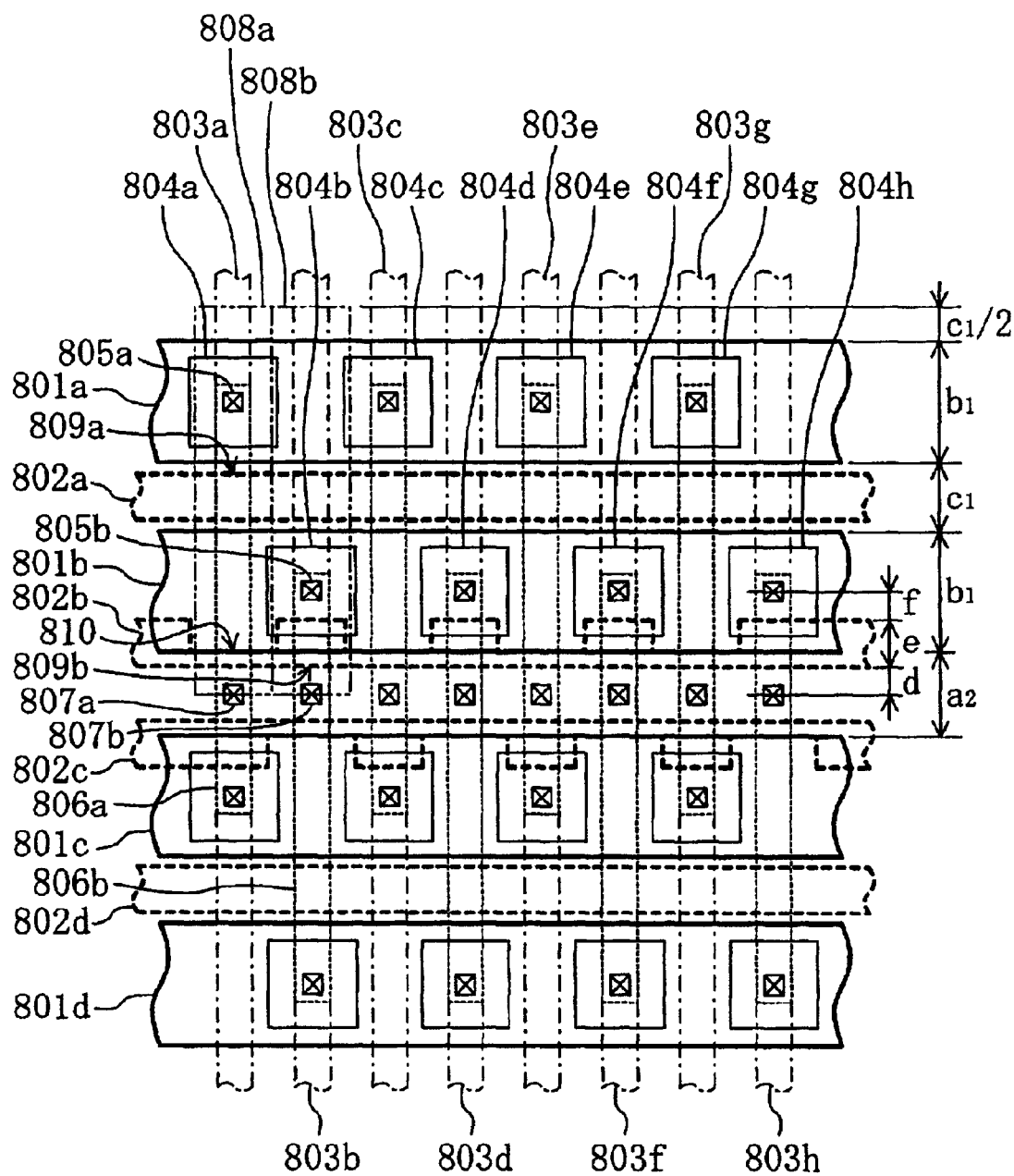
FIG. 20 is a layout of a ferroelectric memory of the eighth embodiment.
Figure 21:
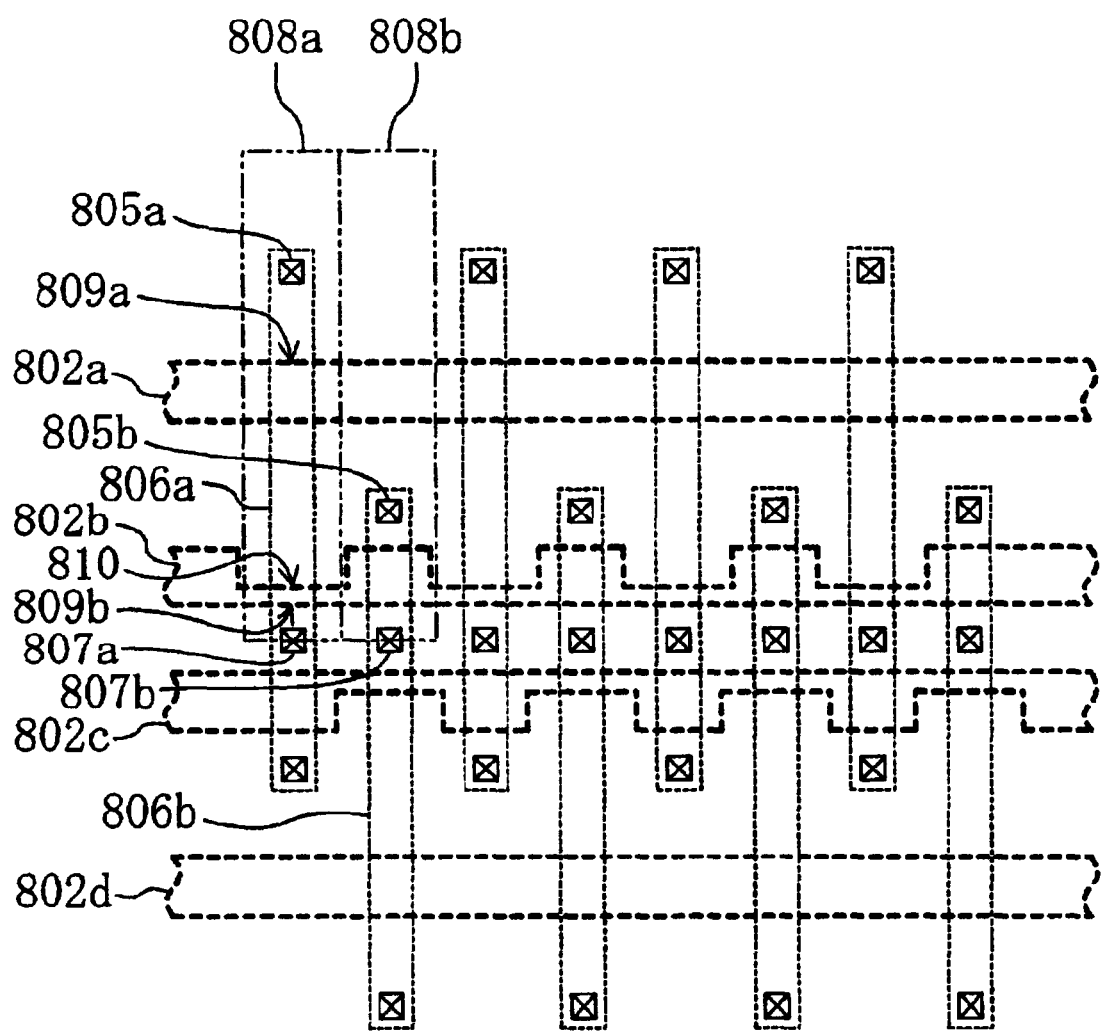
FIG. 21 is a layout of the ferroelectric memory of the eighth embodiment.

FIGS. 20 and 21 show a layout of a ferroelectric memory cell array in the eighth embodiment. Note that FIG. 21 is a view showing only active regions, word lines, bit line contacts and storage node contacts taken from the layout of FIG. 20.

Referring to FIGS. 20 and 21, the reference numerals 801a, 801b, 801c and 801d denote plate lines constructed of upper electrodes of ferroelectric capacitors. The reference numerals 802a and 802d denote first word lines made of polycrystalline silicon constructed of gate electrodes of access transistors, and the reference numerals 802b and 802c denote second word lines made of polycrystalline silicon constructed of gate electrodes of access transistors. The reference numerals 803a, 803b, 803c, 803d, 803e, 803f, 803g and 803h denote bit lines made of aluminum interconnections. The reference numerals 804a, 804b, 804c, 804d, 804e, 804f, 804g and 804h denote storage nodes of ferroelectric memory cells, each constructed of a lower electrode of the ferroelectric capacitor. The reference numerals 808a and 808b denote one-bit ferroelectric memory cells of the onetransistor one-capacitor type, and the reference numerals 809a and 809b denote transistors each constituting the ferroelectric memory cell 808. The reference numeral 810 denotes a short-channel transistor. The reference numerals 805a and 805b denote storage node contacts connecting the storage nodes 804a and 804b and active regions 806a and 806b of the transistors 809a and 809b, respectively, and the reference numerals 807a and 807b denote bit line contacts connecting the bit lines 803a to 803h and the active regions 806a and 806b of the transistors 809a and 809b.

Referring to FIG. 20, the reference code a2 denotes the first inter-plate distance between the adjacent plate lines 801b and 801c with the bit line contacts 807 therebetween, b1 denotes the line width of the plate lines 801a to 801d including the storage nodes 804a to 804h, and c1 denotes the second inter-plate distance between the adjacent plate lines 801a and 801b without the bit line contacts 807 therebetween. The reference code d denotes the distance between one side edge of the second word line 802b and the center of the bit line contacts 807a and 807b, e denotes the line width of the second word line 802b, and f denotes the distance between the other side edge of the second word line 802a and the center of the storage node contact 805b. Note that the first interplate distance a2 is not the shortest distance obtainable e by machining of the plate lines 801b and 801c.

As shown in FIG. 20, the storage nodes 804a and 804b of the ferroelectric capacitors of the ferroelectric memory cells 808a and 808b adjacent to each other in the word line direction are placed at positions offset from each other in the bit line direction.

The length of the ferroelectric memory cells 808a and 808b in the word line direction is set at a half of that of the ferroelectric memory cell 28 in the second conventional example in the word line direction.

The plate lines 801a and 801b are provided for the respective storage nodes 804a and 804b of the ferroelectric memory cells adjacent to each other in the word line direction.

The active region 806a of each transistor 809a constituting the ferroelectric memory cell 808a out of the pairs of the ferroelectric memory cells 808a and 808b adjacent to each other in the word line direction extend through in the bit line direction between the storage nodes of the ferroelectric capacitors constituting the other adjacent ferroelectric memory cells 808b, intersecting with the plate line 801b for the ferroelectric memory cells 808b. On the contrary, the active region 806b of each transistor 809b constituting the ferroelectric memory cell 808b does not intersect with the plate line 801a for the ferroelectric memory cells 808a.

The first word line 802a corresponds to the transistors 809a constituting the ferroelectric memory cells 808a, and the second word line 802b corresponds to the transistors 809b constituting the ferroelectric memory cells 808b.

The second word line 802b is narrowed at portions intersecting with the active regions 806a of the transistors 809a each constituting the ferroelectric memory cell 808a to a degree that the active regions 806a are prevented from being turned to the OFF state, thereby forming the short-channel transistors 810.

Thus, the ferroelectric memory cell 808a as one of each pair has the normal transistor 809a and the short-channel transistor 810. However, since the source-drain impedance of the short-channel transistor 810 is low, the influence of the short-channel transistor 810 on the ferroelectric memory cell 808a is negligible.

By using the short-channel transistor 810, the active region 806a intersects with the second word line 802b that is different from the first word line 802a constituting the transistor 809a connected with the storage node 804a of the ferroelectric memory cell 808a.

The length L8 of the ferroelectric memory cells 808a and 808b in the eighth embodiment in the bit line direction satisfies L8=d+e+f+b1/2+c1+b1+c1/2.

The length of the ferroelectric memory cells 808a and 808b in the eighth embodiment in the word line direction is a half of the length W12 of the ferroelectric memory cell 28 in the second conventional example in the word line direction. Therefore, the area S8 of the ferroelectric memory cells 808a and 808b in the eighth embodiment satisfies $$S8=(d+e+f+b1/2+c1+b1+c1/2)\times W12/2.$$

Since d+e+f>b1/2+c1/2, the following relationship is satisfied.

$$S8 <(2d+2e+2f+b1+c1)\times W12/2<(d+e+f+b1/2+c1+b1/2)\times W12=S12$$
(area of the ferroelectric memory cell 28 in the second conventional example)

Thus, the area of the ferroelectric memory cells 808a and 808b in the eighth embodiment can be made smaller than the area of the ferroelectric memory cell 28 in the second conventional example.

(Ninth embodiment)

Hereinafter, a ferroelectric memory of the ninth embodiment will be described with reference to FIGS. 22, 23 and 24.

Figure 22:
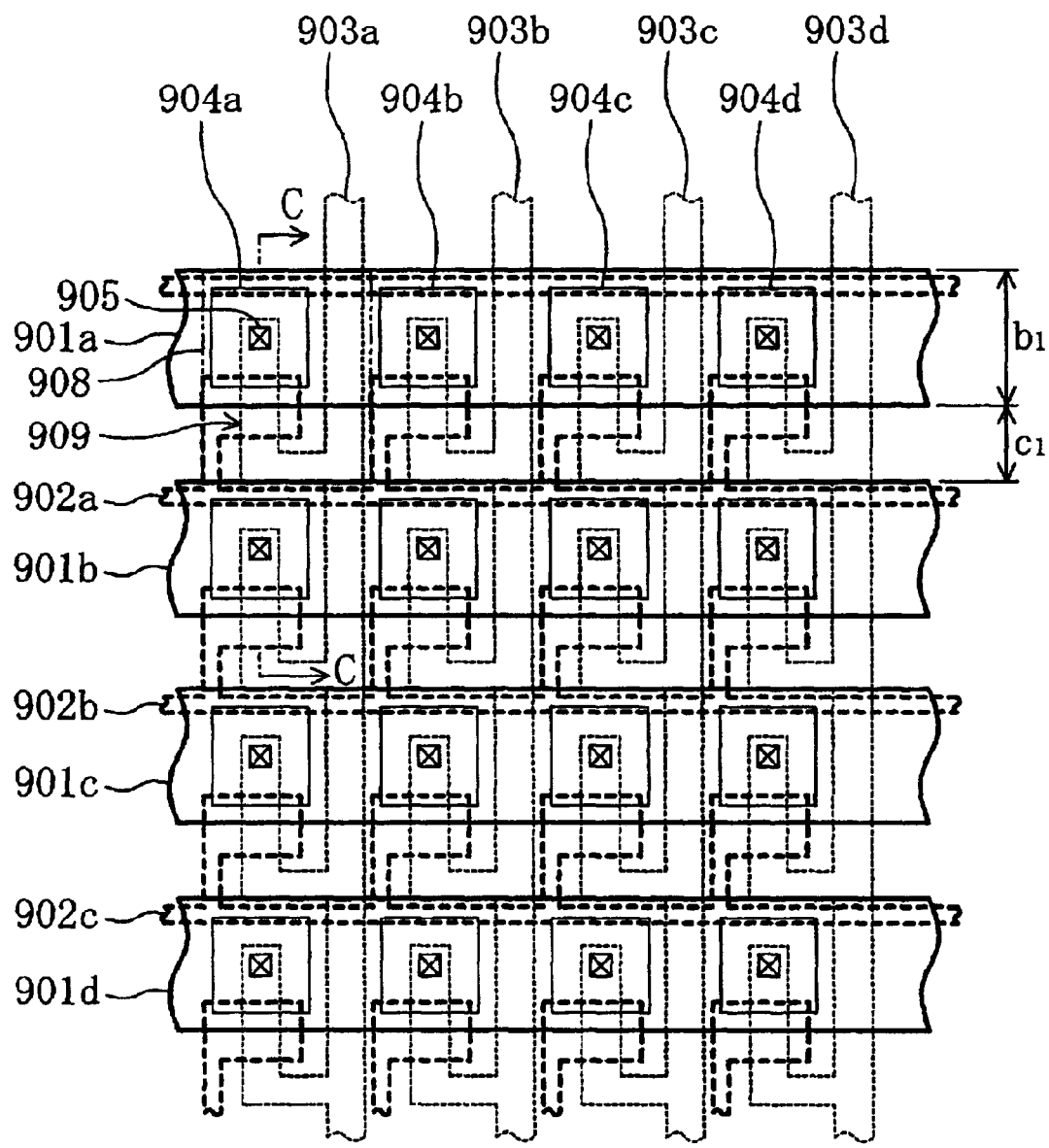
FIG. 22 is a layout of a ferroelectric memory of the ninth embodiment.
Figure 23:
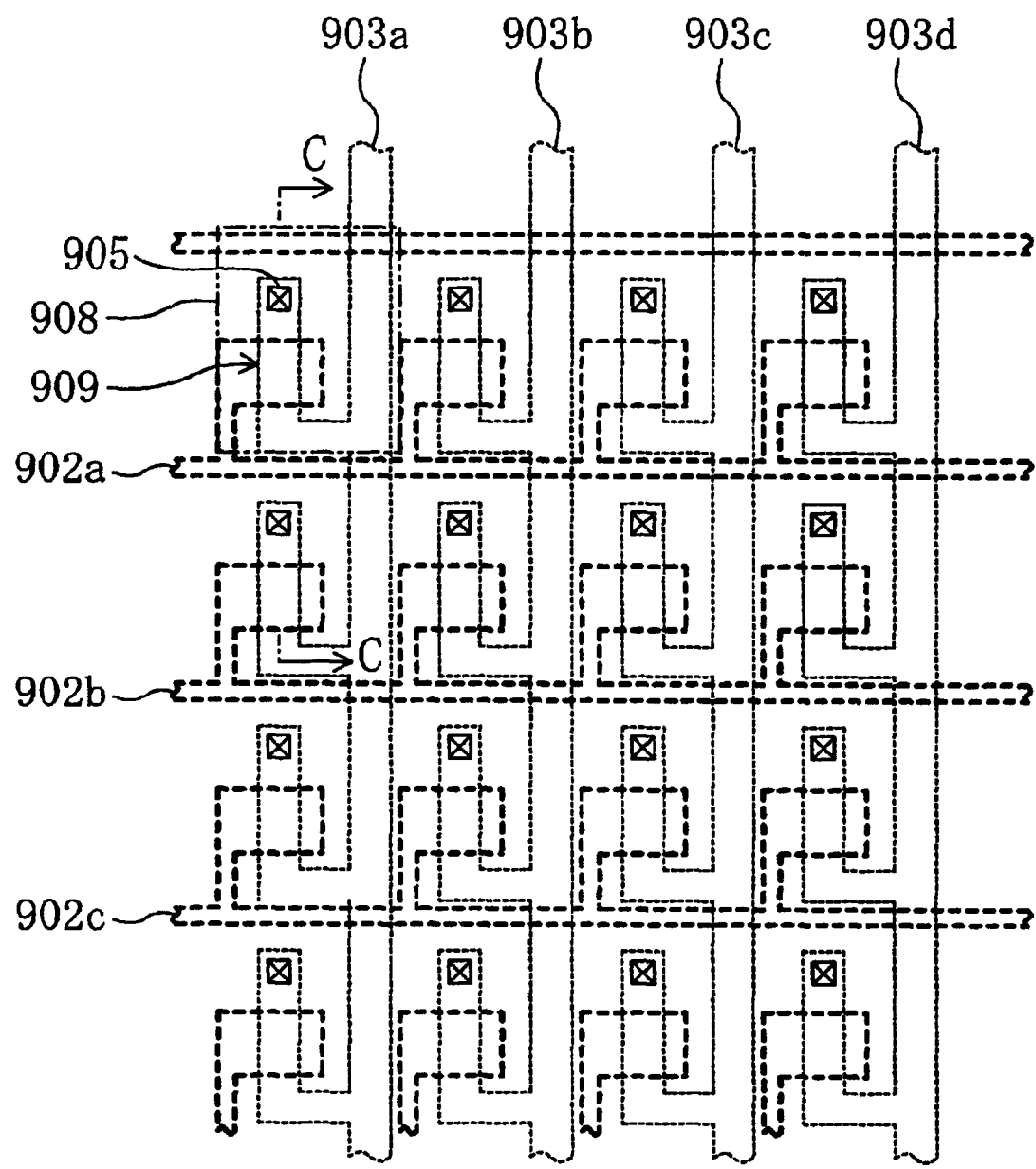
FIG. 23 is a layout of the ferroelectric memory of the ninth embodiment.
Figure 24:
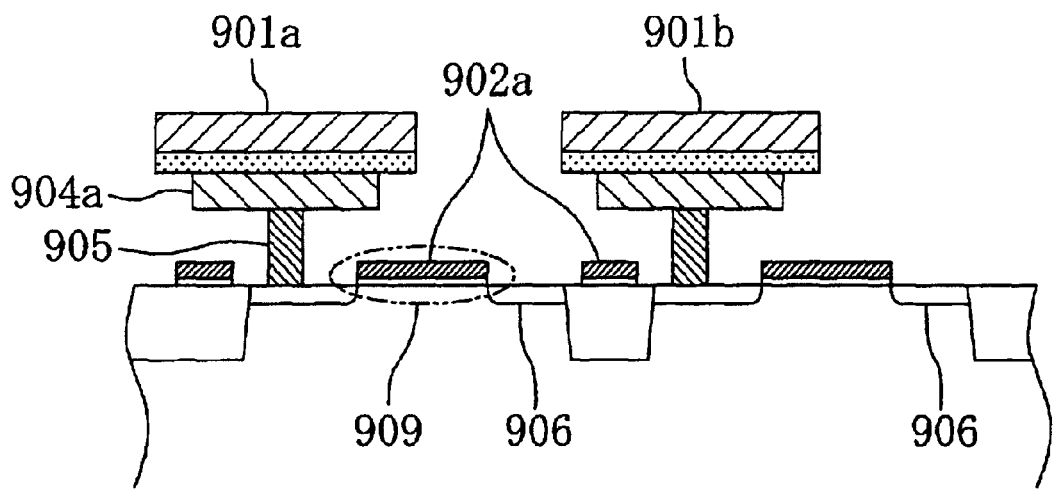
FIG. 24 is a cross-sectional view of the ferroelectric memory of the ninth embodiment, taken long line C—C of FIGS. 22 and 23.
Figure 25:
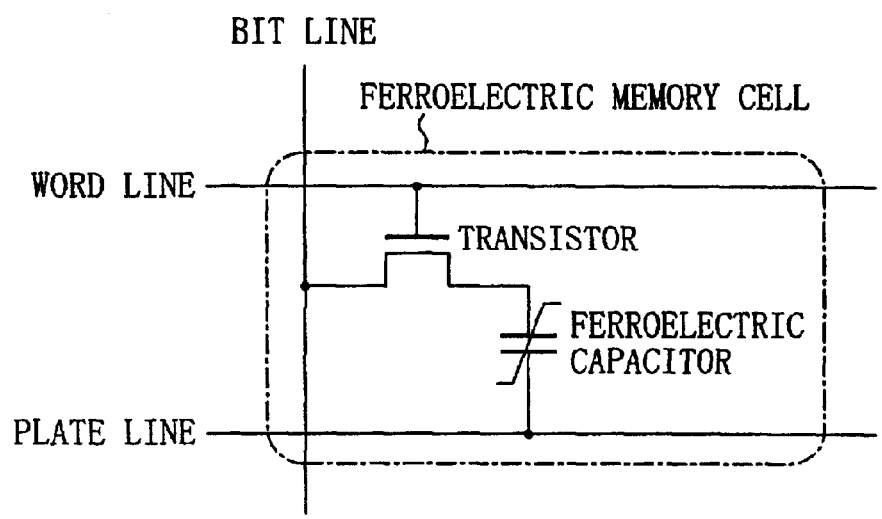
FIG. 25 is a view showing a circuit configuration of a ferroelectric memory common to the first and second conventional examples and the first to ninth embodiments of the present invention.
Figure 26:
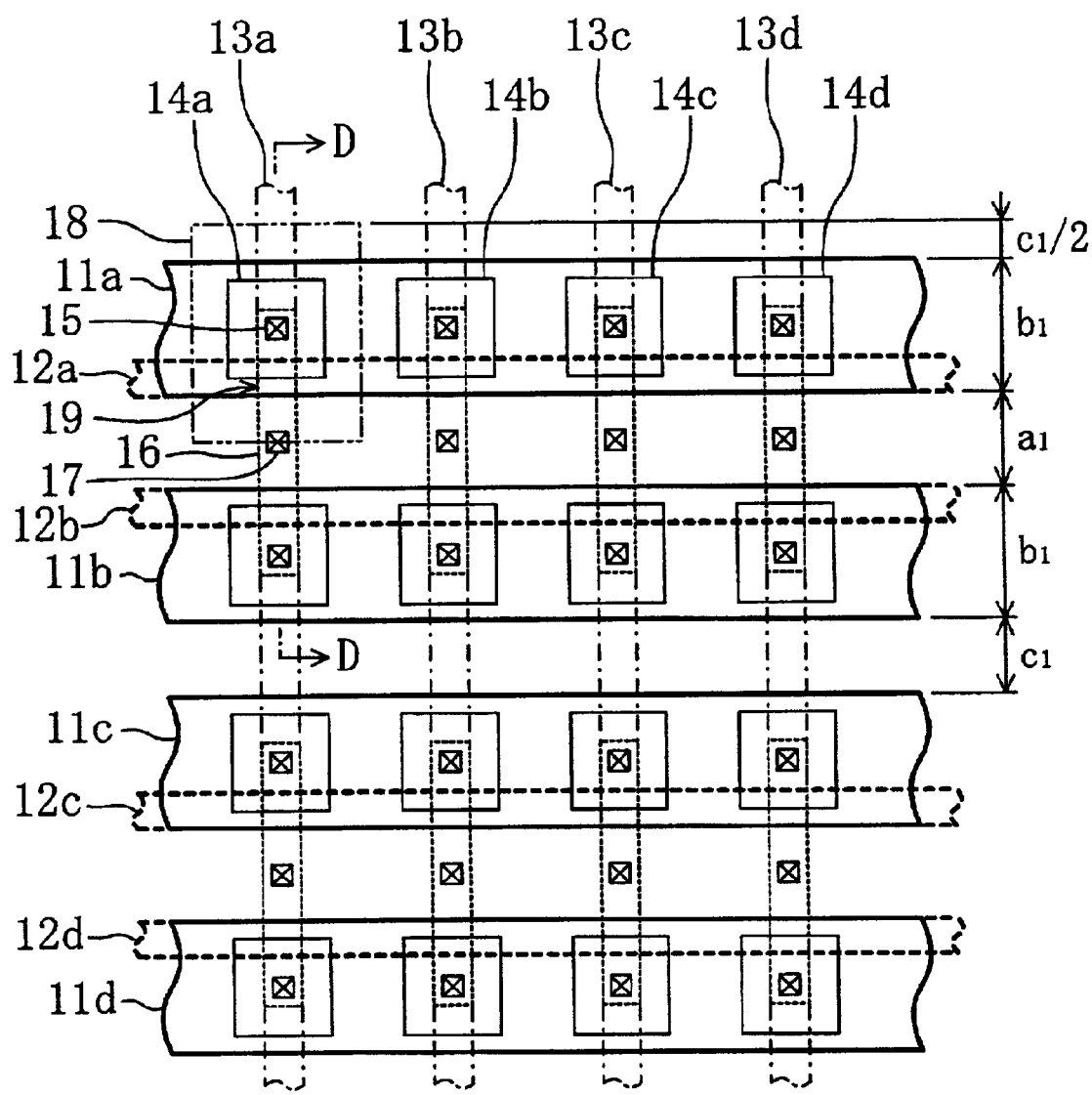
FIG. 26 is a layout of the ferroelectric memory of the first conventional example.
Figure 27:
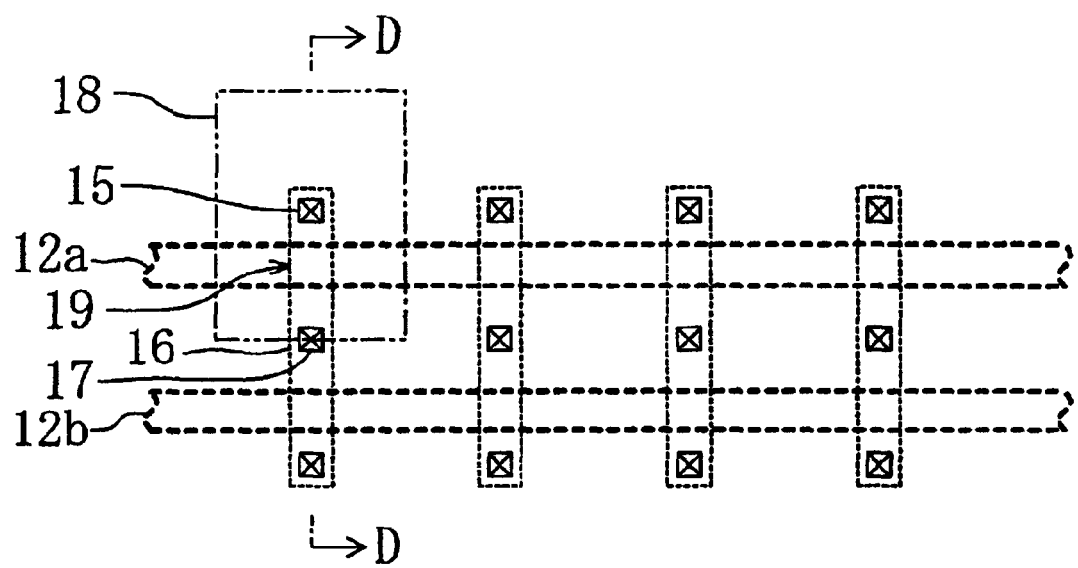
FIG. 27 is a layout of the ferroelectric memory of the first conventional example.
Figure 27:
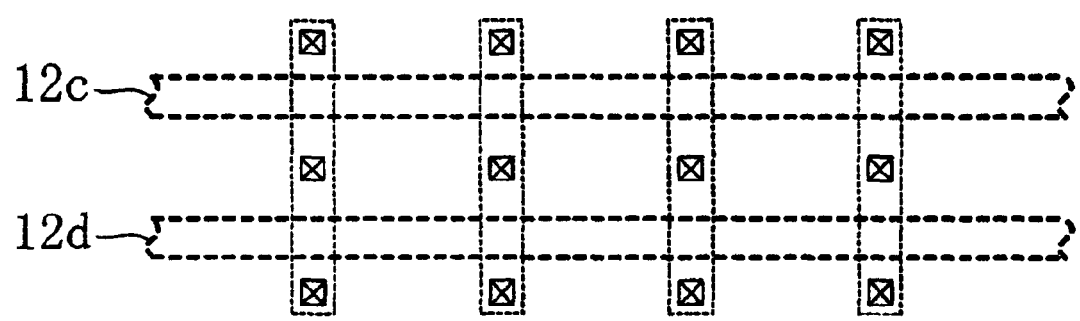
Figure 28:
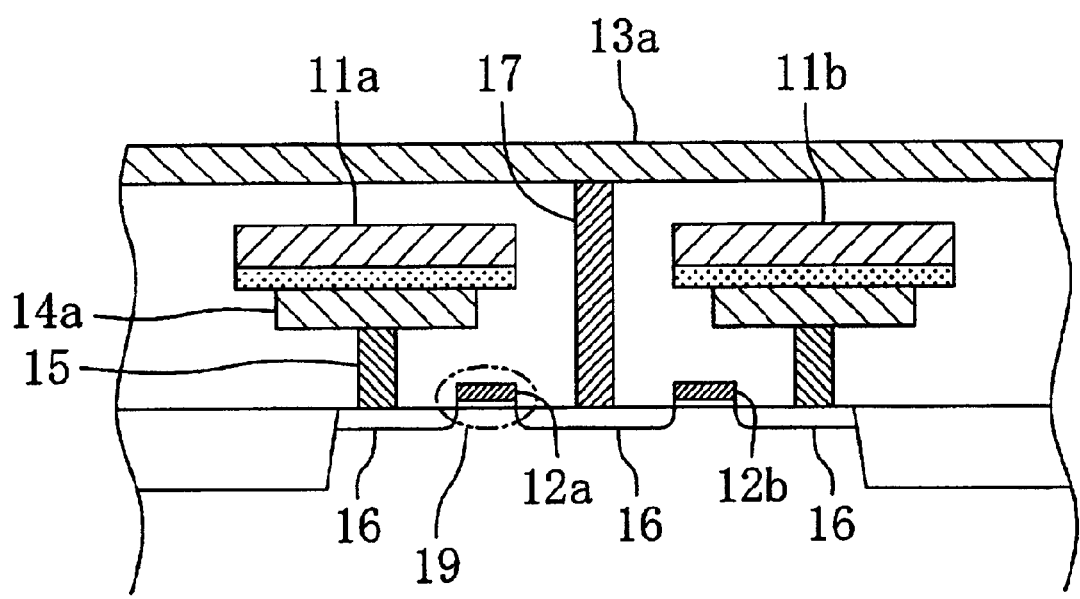
FIG. 28 is a cross-sectional view of the ferroelectric memory of the first conventional example, taken long line D—D of FIGS. 26 and 27.
Figure 29:
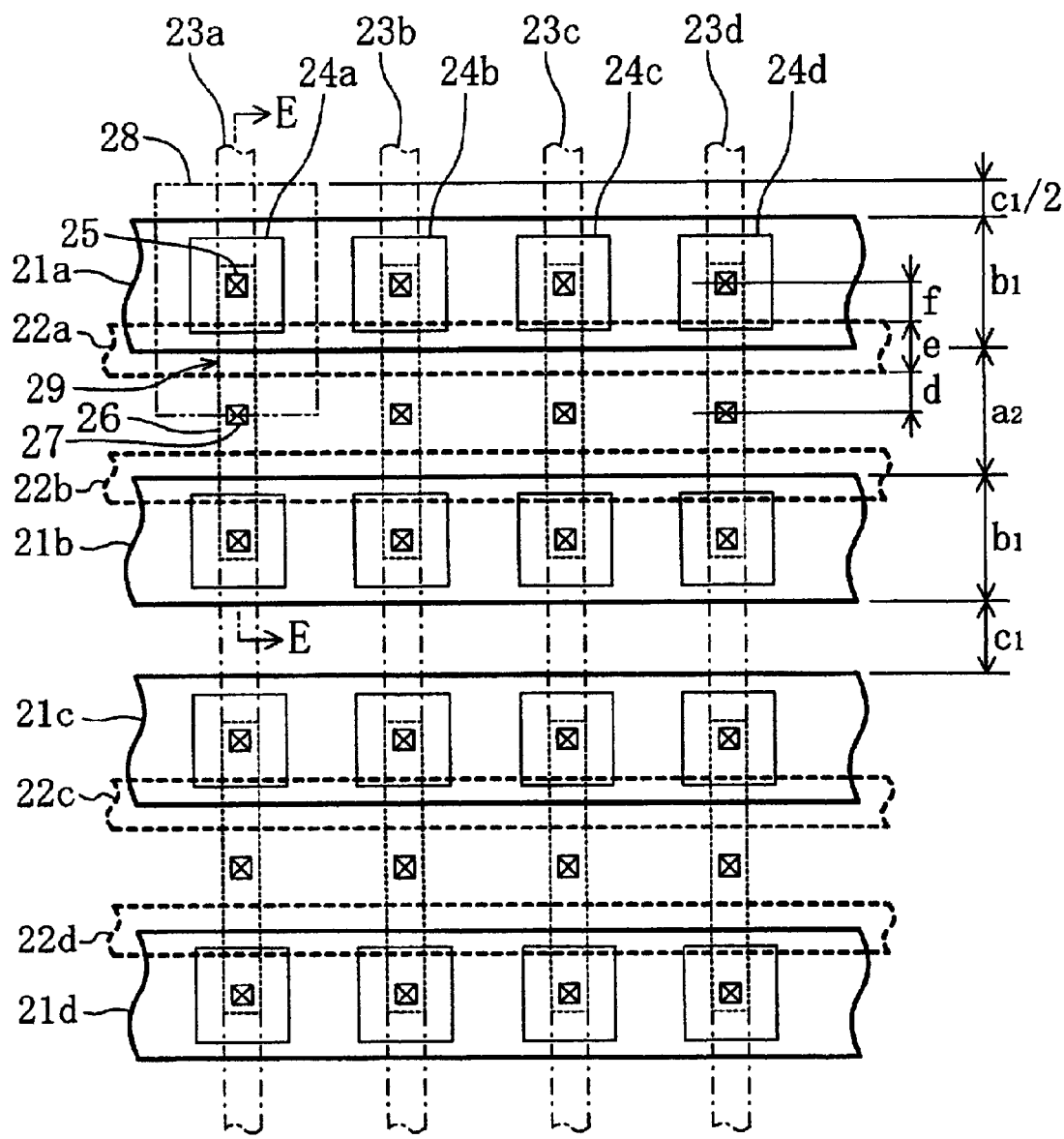
FIG. 29 is a layout of the ferroelectric memory of the second conventional example.
Figure 30:
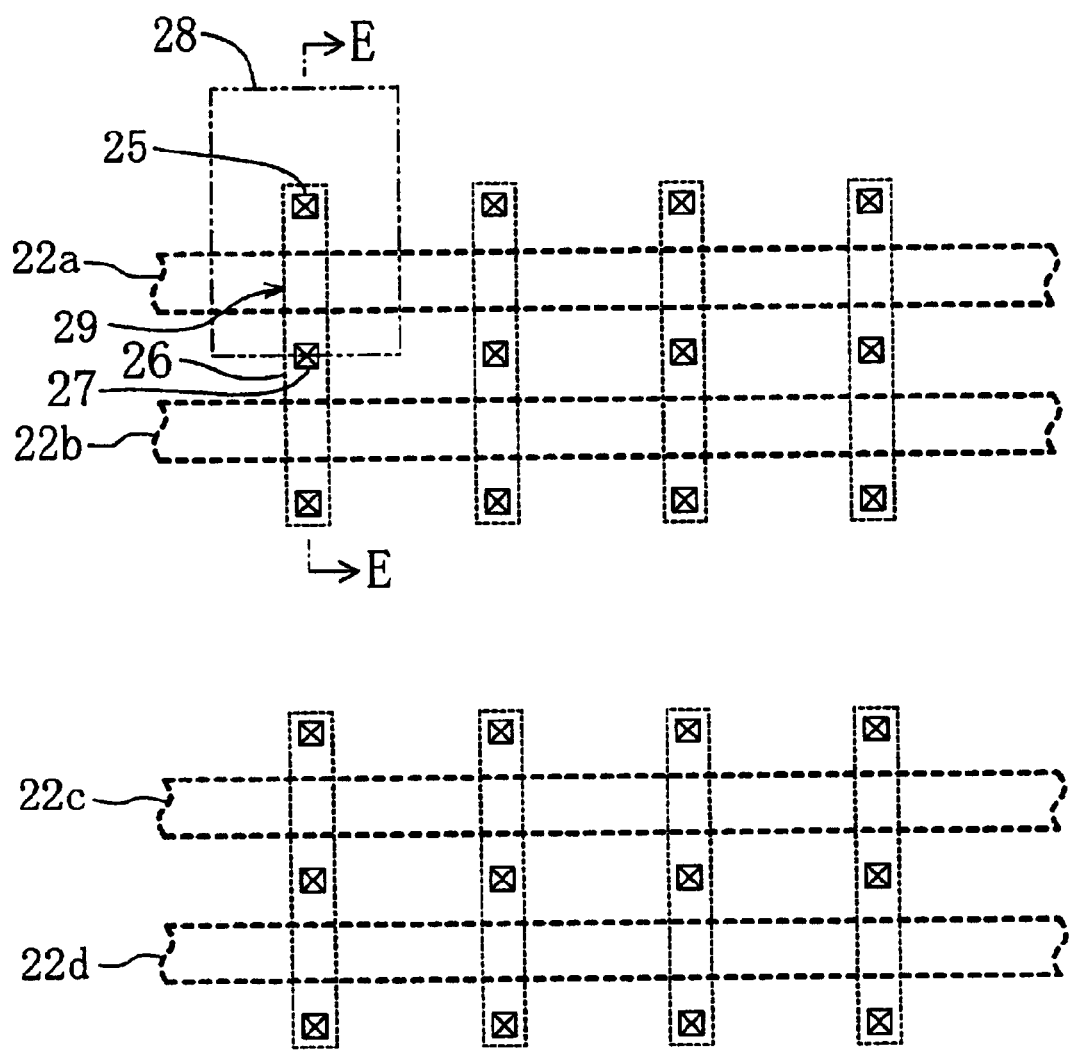
FIG. 30 is a layout of the ferroelectric memory of the second conventional example.
Figure 31:
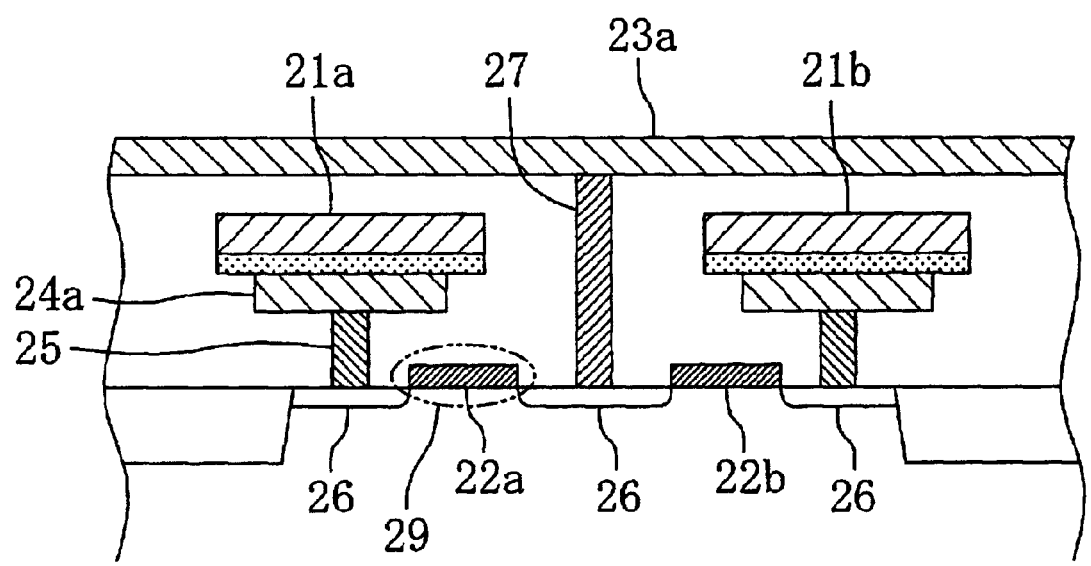
FIG. 31 is a cross-sectional view of the ferroelectric memory of the second conventional example, taken long line E—E of FIGS. 29 and 30.

FIGS. 22 and 23 show a layout of a ferroelectric memory cell array in the ninth embodiment, and FIG. 24 shows a cross-sectional structure taken along line C—C of FIGS. 22 and 23. Note that FIG. 23 is a view showing only active regions, word lines, bit line contacts and storage node contacts taken from the layout of FIG. 22.

Referring to FIGS. 22, 23 and 24, the reference numerals 901a, 901b, 901c and 901d denote plate lines constructed of upper electrodes of ferroelectric capacitors. The reference numerals 902a, 902b and 902c denote word lines made of polycrystalline silicon constructed of gate electrodes of access transistors. The reference numerals 903a, 903b, 903c and 903d denote bit lines constructed of active regions. The reference numerals 904a, 904b, 904c and 904d denote storage nodes of ferroelectric memory cells, each constructed of a lower electrode of the ferroelectric capacitor. The reference numeral 908 denotes a one-bit ferroelectric memory cell of the one-transistor one-capacitor type, and the reference numeral 909 denotes a transistor constituting the ferroelectric memory cell 908. The reference numeral 905 denotes storage node contacts connecting the storage nodes 904a to 904d and the bit lines 903a to 903d constructed of the active regions.

Referring to FIG. 22, the reference code b1 denotes the line width of the plate lines 901a to 901d including the storage nodes 904a to 904d, and c1 denotes the distance between the adjacent plate lines 901a and 901b without bit line contacts therebetween.

The bit lines are formed integrally with the active regions of the transistors 909 of the ferroelectric memory cells 908 lined in the bit line direction and also run through in the bit line direction between the storage nodes 904a to 904d of the ferroelectric capacitors of pairs of the ferroelectric memory cells 908 adjacent to each other in the word line direction.

The word lines 902a to 902c are provided in common for the ferroelectric memory cells 908 lined in the word line direction. Each of the word lines 902a to 902c has: interconnections formed above the bit lines 903a to 903d having a width narrow enough to prevent the bit lines 903a to 903d from being turned to the OFF state and; and gate electrodes formed above the active regions of the transistors 909 having a width wider than the narrow interconnections.

In the ninth embodiment, the bit lines 903a to 903d are constructed of the active regions. Therefore, unlike the case of the bit lines made of aluminum interconnections, it is unnecessary to provide bit line contacts for connecting the bit lines with the active regions.

The length L9 of the ferroelectric memory cell 908 in the ninth embodiment in the bit line direction satisfies L9=b1+c1.

Since d+e+f>c1/2+b1/2, the following relationship is satisfied.

$$L9=(b1/2+c1/2)+(b1/2+c1/2)<d+e+f+(b1/2+c1/2)=L12 \text{ (length of the ferroelectric memory cell 28 in the second conventional example in the bit line direction)}$$

Thus, the area of the ferroelectric memory cell 908 in the ninth embodiment can be made smaller than the area of the ferroelectric memory cell 28 in the second conventional example.

What is claimed is:

1. A ferroelectric memory in which a plurality of memory cells each having a transistor and a ferroelectric capacitor are arranged in a matrix, wherein ferroelectric capacitors of one set of memory cells adjacent to each other in the word line direction among the plurality of memory cells are placed at positions offset from each other in the bit line direction, a word line is placed in common for the transistors of the set of memory cells, a plate line is placed in common for the ferroelectric capacitors of the set of memory cells, and bit line contacts each for connecting a bit line and an active region of the transistor are placed between the plate lines adjacent to each other in a bit line direction.

2. A ferroelectric memory in which a plurality of memory cells each having a transistor and a ferroelectric capacitor are arranged in a matrix, wherein ferroelectric capacitors of one set of memory cells adjacent to each other in the word line direction among the plurality of memory cells are placed at positions offset from each other in the bit line direction, a word line is placed in common for the transistors of the set of memory cells, plate lines are placed separately for the respective ferroelectric capacitors of the set of memory cells, and bit line contacts each for connecting a bit line and an active region of the transistor are placed between plate line groups each composed of the plurality of plate lines corresponding to the set of memory cells.

3. A ferroelectric memory in which a plurality of memory cells each having a transistor and a ferroelectric capacitor are arranged in a matrix, wherein ferroelectric capacitors of one set of memory cells adjacent to each other in the word line direction among the plurality of memory cells are placed at positions offset from each other in the bit line direction, a plate line is placed in common for the ferroelectric capacitors of the set of memory cells, and bit line contacts each for connecting a bit line and an active region of the transistor are placed on both sides of the plate line in the bit line direction.

* * * * *